US009831373B2

(12) United States Patent
Inoue et al.

(10) Patent No.: US 9,831,373 B2
(45) Date of Patent: Nov. 28, 2017

(54) ILLUMINANCE SENSOR, PROXIMITY SENSOR, AND DISPLAY DEVICE INCLUDING THE SENSOR

(71) Applicant: SHARP KABUSHIKI KAISHA, Osaka-shi, Osaka (JP)

(72) Inventors: Takahiro Inoue, Osaka (JP); Tadamasa Kimura, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 376 days.

(21) Appl. No.: 14/420,841

(22) PCT Filed: Jul. 9, 2013

(86) PCT No.: PCT/JP2013/068778
§ 371 (c)(1),
(2) Date: Feb. 10, 2015

(87) PCT Pub. No.: WO2014/041884
PCT Pub. Date: Mar. 20, 2014

(65) Prior Publication Data
US 2015/0207014 A1    Jul. 23, 2015

(30) Foreign Application Priority Data

Sep. 11, 2012   (JP) .................................. 2012-199995

(51) Int. Cl.
*H01L 31/101*    (2006.01)
*H01L 31/167*    (2006.01)
(Continued)

(52) U.S. Cl.
CPC .......... *H01L 31/101* (2013.01); *G01J 1/0488* (2013.01); *G01J 1/4204* (2013.01);
(Continued)

(58) Field of Classification Search
CPC ............. H01L 31/101; H01L 31/02162; H01L 31/1013
See application file for complete search history.

(56) References Cited

U.S. PATENT DOCUMENTS 8,274,051 B1     9/2012  Aswell et al.
2004/0251404 A1* 12/2004 Duijve ..................... G01J 3/51
                                              250/226
(Continued)

FOREIGN PATENT DOCUMENTS

JP    2006-332226 A    12/2006
JP    2007-305868 A    11/2007
JP    2011-60788 A      3/2011

*Primary Examiner* — Kyoung Lee
*Assistant Examiner* — Christina Sylvia
(74) *Attorney, Agent, or Firm* — Birch, Stewart, Kolasch & Birch, LLP

(57) ABSTRACT

In order to provide a single-unit sensor which serves as both an illuminance sensor and a proximity sensor, the sensor (1) includes a light receiving element section (E1), an infrared cut-off filter (IRcutF), and a switching section (SWS) for switching spectral characteristics of the light receiving element section (E1). The infrared cut-off filter (IRcutF) has an opening, and an infrared light receiving P-N junction (PDir) is provided at a location deeper in a substrate than a visible light receiving P-N junction (PDvis).

20 Claims, 21 Drawing Sheets

(51) Int. Cl.
    *G01J 1/42*      (2006.01)
    *G01J 1/44*      (2006.01)
    *G01J 3/30*      (2006.01)
    *G01J 3/51*      (2006.01)
    *G01J 1/04*      (2006.01)
    *G09G 3/34*      (2006.01)
    *G09G 3/36*      (2006.01)
    *H01L 31/0232*   (2014.01)
    *H01L 31/0216*   (2014.01)

(52) U.S. Cl.
    CPC .............. *G01J 1/4228* (2013.01); *G01J 1/44* (2013.01); *G01J 3/30* (2013.01); *G01J 3/51* (2013.01); *G09G 3/3406* (2013.01); *G09G 3/36* (2013.01); *H01L 31/02162* (2013.01); *H01L 31/02327* (2013.01); *H01L 31/1013* (2013.01); *H01L 31/167* (2013.01); *G09G 2320/0626* (2013.01); *G09G 2320/0633* (2013.01); *G09G 2330/021* (2013.01); *G09G 2360/144* (2013.01); *G09G 2360/145* (2013.01)

(56) References Cited

U.S. PATENT DOCUMENTS

| | | |
|---|---|---|
| 2006/0266928 A1 | 11/2006 | Takiba et al. |
| 2008/0067330 A1* | 3/2008 | Yamamoto ............... G01J 3/51 |
| | | 250/226 |
| 2012/0229916 A1* | 9/2012 | Yano ................. G02B 13/0085 |
| | | 359/707 |
| 2015/0199934 A1* | 7/2015 | Kimura .................... G01J 1/32 |
| | | 345/690 |

\* cited by examiner

F I G. 8
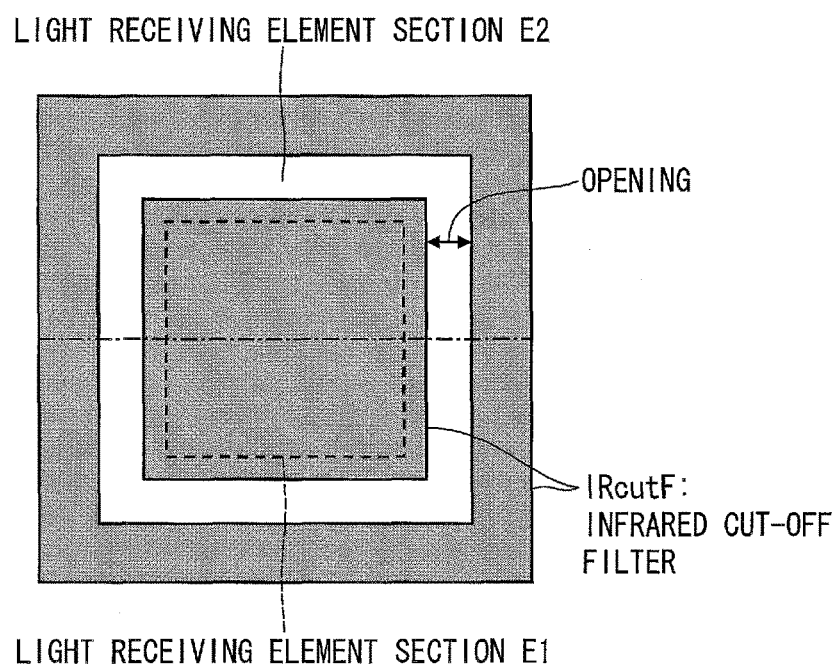

F I G. 1 1
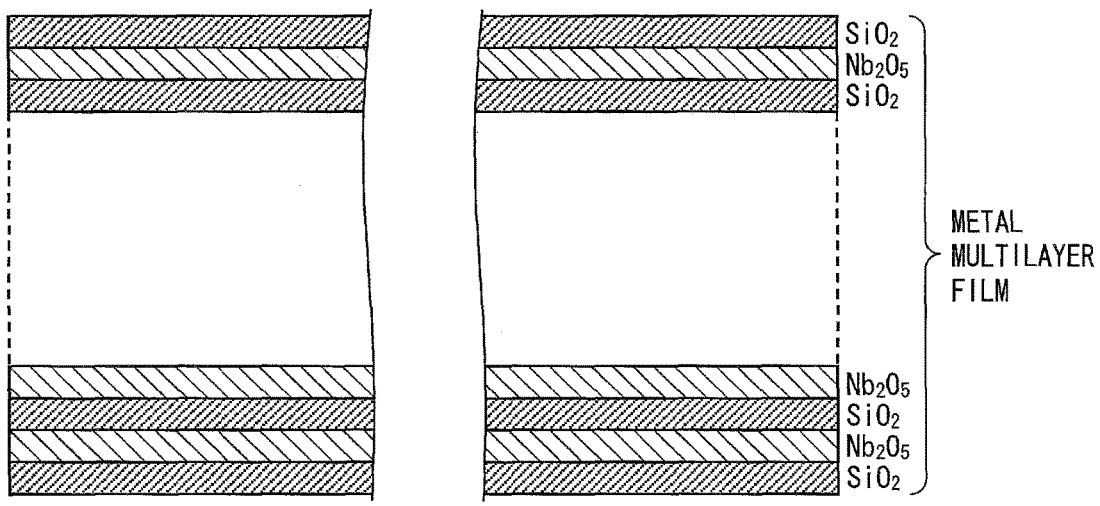

FIG. 20　　　　　　　　　　　Related Art
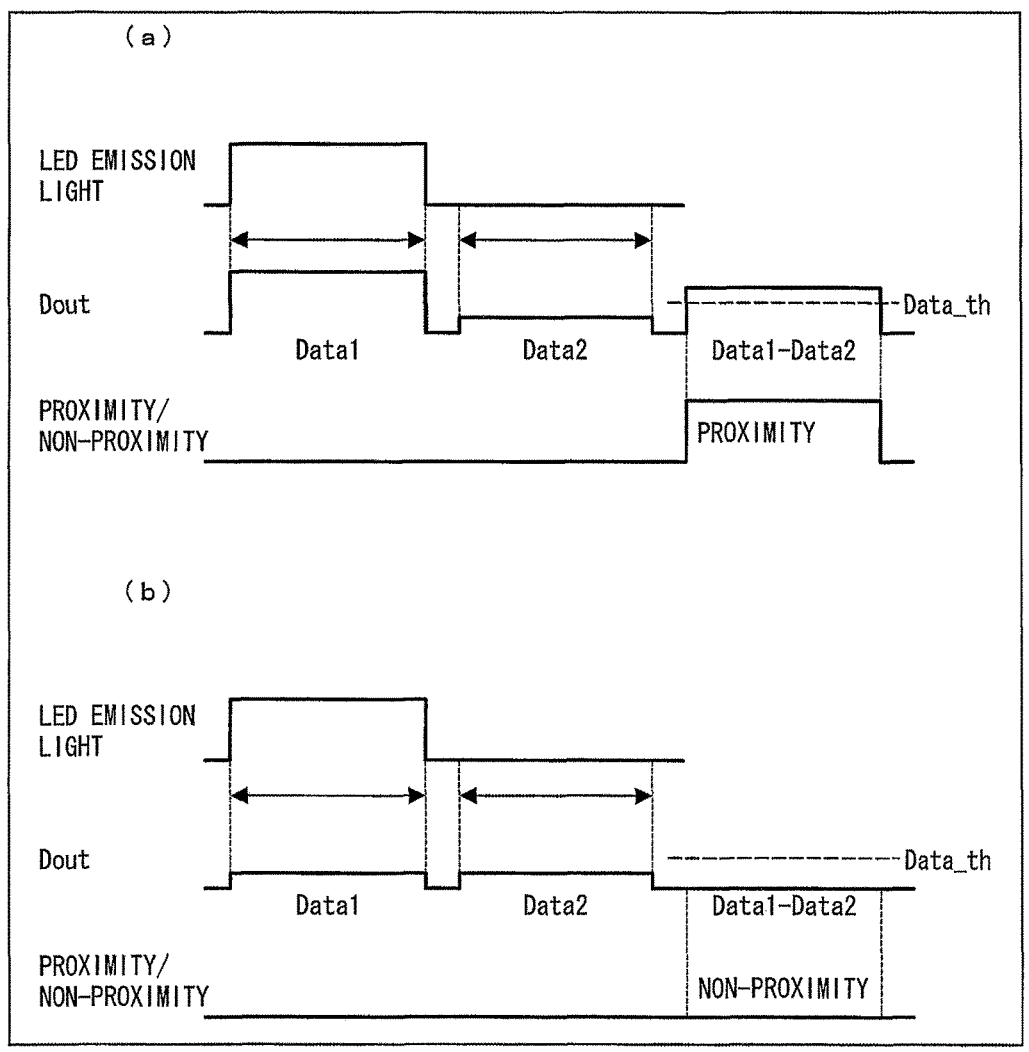

F I G. 2 1
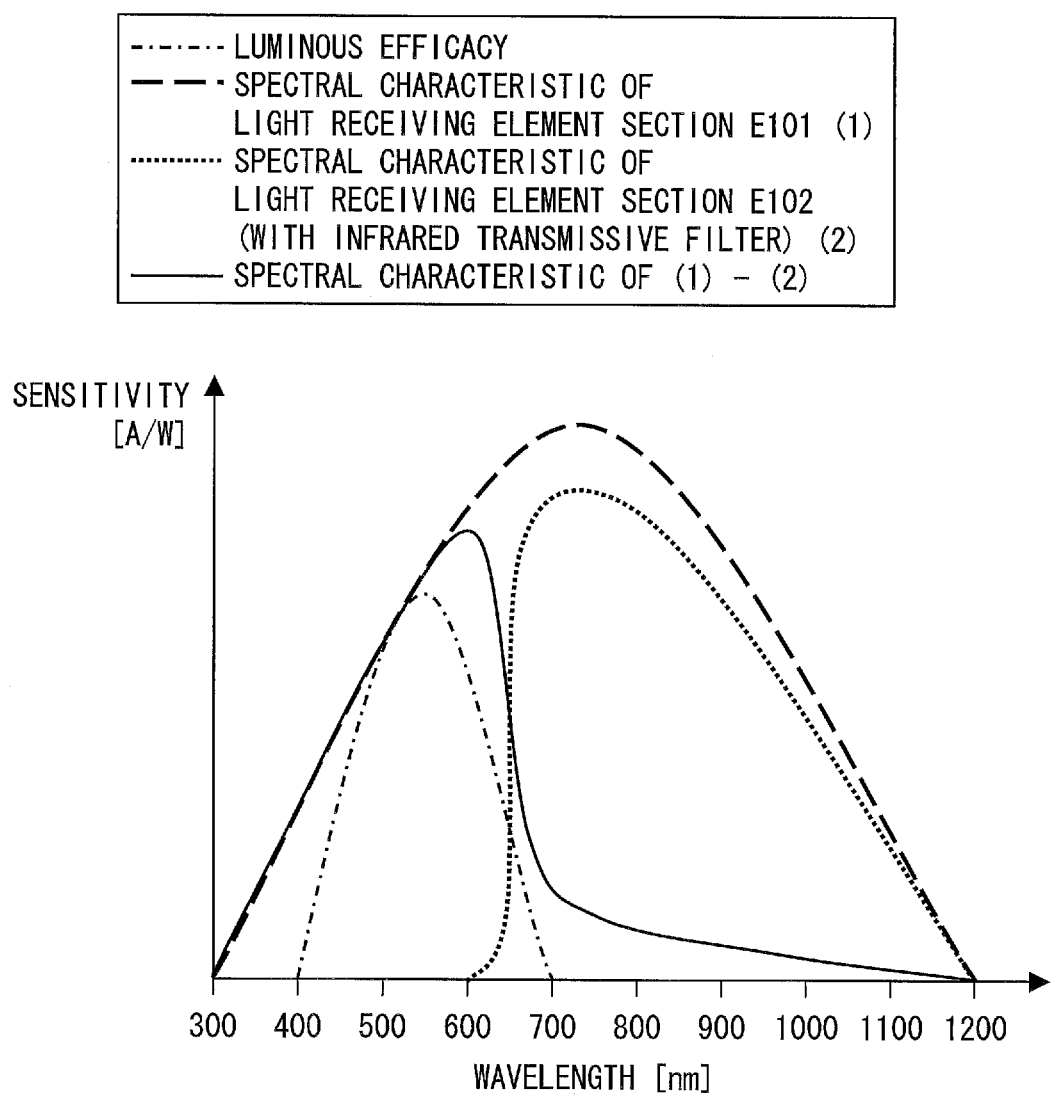

ILLUMINANCE SENSOR, PROXIMITY SENSOR, AND DISPLAY DEVICE INCLUDING THE SENSOR

TECHNICAL FIELD

The present invention relates to an illuminance sensor, a proximity sensor, and a display device including the sensors.

BACKGROUND ART

A mobile telephone, a digital camera, or the like includes a display device, and the display device is configured by, for example, a liquid crystal panel. Such a display device displays information by utilizing emitted light. Under the circumstances, there have been demands to control an amount of emitted light based on an illuminance of the emitted light which has been measured by an illuminance sensor. For example, there have been demands as follows: that is, in a case where a liquid crystal panel is used as the display device, an amount of light emitted by a backlight of the liquid crystal panel is optimally controlled so as to improve display image quality and/or to reduce power consumption.

Moreover, in a case of a mobile terminal such as a mobile telephone or a smart phone, it is preferable to turn off a display device while it is unnecessary to view the display device (e.g., while talking on the terminal), in view of reduction in power consumption. In order to judge such a case, there has been a demand to detect approach of a face of a user, who is using the mobile terminal, to the mobile terminal by a proximity sensor.

Moreover, there has been a demand to reduce a size of a mobile terminal, and recently, a small single-unit illuminance/proximity sensor has been proposed which serves as both an illuminance sensor and a proximity sensor.

Here, the illuminance sensor is required to have a spectral characteristic near to luminous efficacy. The spectral characteristic near to luminous efficacy means a spectral characteristic which has a sensitivity mainly in a visible light region. That is, it is preferable that an infrared component can be removed from light which is to be received by the illuminance sensor. Meanwhile, the proximity sensor detects proximity by utilizing infrared light, and it is therefore preferable that an infrared component is selectively contained in light which is to be received by the proximity sensor.

As such, in order to realize a single-unit illuminance/proximity sensor, it is necessary to achieve both the conflicting functions, i.e., removal and utilization of an infrared component.

Patent Literature 1 discloses a semiconductor light sensor which includes, in order to achieve a spectral characteristic near to luminous efficacy in an illuminance sensor, (i) a first amplifier circuit which amplifies a photoelectric current supplied from a first photodiode, (ii) a second amplifier circuit which amplifies a photoelectric current supplied from a second photodiode and has an amplifying characteristic that is substantially identical with that of the first amplifier circuit, and (iii) an infrared transmissive filter which is provided on the second photodiode and attenuates, relative to an infrared light component, a visible light component in incoming light. In the semiconductor light sensor, a difference between an output of the first amplifier circuit and an output of the second amplifier circuit is outputted by a subtracting circuit.

In order to provide an illuminance sensor for which an infrared component is removed from incoming light, a difference between outputs of a plurality of photodiodes, which have different spectral characteristics, is generally obtained as in the configuration disclosed in Patent Literature 1.

FIG. 16 is a schematic view illustrating a configuration of a sensor 100 in accordance with a conventional technique disclosed in Patent Literature 1. As illustrated in FIG. 16, the sensor 100 includes a light receiving element section E101, a light receiving element section E102, and an infrared transmissive filter IRthrF which attenuates, relative to an infrared light component, a visible light component from incoming light toward the light receiving element section E102. Here, the light receiving element sections are configured by respective photodiodes having different spectral characteristics. Moreover, the light receiving element section E102 is provided with the infrared transmissive filter IRthrF, and outputs an electric current, which corresponds to the infrared component in the incoming light, by attenuating the visible light component from the incoming light relative to the infrared component. Then, from an electric current outputted by the light receiving element section E101, an electric current outputted by the light receiving element section E102 is subtracted, and thus influence of infrared light is eliminated and a spectral characteristic corresponding to luminous efficacy is obtained.

Patent Literature 2 discloses a light receiving element which includes (i) a first semiconductor layer having a first conductivity type, (ii) a second semiconductor layer which is embedded in a surface layer part of the first semiconductor layer and has a second conductivity type different from the first conductivity type, (iii) a third semiconductor layer which is embedded in a surface layer part of the second semiconductor layer and has the first conductivity type, and (iv) a wire via which the second semiconductor layer and the third semiconductor layer are connected with each other. That is, Patent Literature 2 discloses a configuration in which light receiving elements are used which are arranged at different junction depths.

FIG. 17 is a schematic view illustrating a configuration of a light receiving element section 200 in accordance with a conventional technique disclosed in Patent Literature 2. As illustrated in FIG. 17, the light receiving element section 200 includes a first photodiode PD1 and a second photodiode PD2 which is provided at a location shallower than that of the first photodiode PD1. Further, the second photodiode PD2 is short-circuited by a wire 201. With the configuration, an electric current, which corresponds to light that has entered the second photodiode, will not be outputted. That is, according to the light receiving element section 200, a spectral characteristic becomes near to luminous efficacy in a short wavelength region, and an electric current I corresponding to the spectral characteristic is outputted via the wire 202.

Patent Literature 3 discloses a proximity illuminance sensor which includes (i) a light-emitting element, (ii) an illuminance sensor light receiving element, (iii) a distance detecting light receiving element, (iv) a first visible light resin which molds to the illuminance sensor light receiving element, and (v) an infrared cut filter which is provided so as to cover an entire surface of the first visible light resin which surface is opposite to a surface that makes contact with the substrate.

FIG. 18 is a schematic view illustrating a configuration of a sensor 300 in accordance with a conventional technique disclosed in Patent Literature 3. According to the sensor 300 illustrated in FIG. 18, an illuminance sensor light receiving element E301 and a proximity sensor light receiving element E302 are embedded in a resin sealing part 301. Here, on a surface of the resin sealing part 301, a lens shape 302 can be molded.

An infrared cut-off filter IRcutF is provided on an upper surface of the resin sealing part, and therefore the illuminance sensor light receiving element E301 selectively receives visible light, and a spectral characteristic becomes near to luminous efficacy. Moreover, the proximity sensor light receiving element E302 receives infrared light which has been reflected from a proximity detectable object and has passed through the resin sealing part 301.

The following description will discuss a general proximity sensor with reference to FIG. 19 and FIG. 20.

FIG. 19 is schematic view illustrating a configuration of a general proximity sensor in accordance with a conventional technique. The proximity sensor illustrated in FIG. 19 includes a light emitting diode LED, a photodiode PD, and a control circuit. The control circuit supplies a pulsed current to the light emitting diode LED so as to drive the light emitting diode LED. Thus, the light emitting diode LED emits pulsed light. In a case where a proximity detectable object exists in the vicinity of the proximity sensor, pulsed light emitted by the light emitting diode LED is reflected by the proximity detectable object as indicated by the solid arrow and is then received by the photodiode PD. On the other hand, in a case where no detectable object exists, the pulsed light emitted by the light emitting diode LED is not reflected by a detectable object as indicated by the dotted arrow, and therefore the pulsed light from the light emitting diode LED hardly reaches the photodiode PD.

The photodiode PD converts received light into an electric current, and outputs the electric current to the control circuit. The control circuit judges, based on a magnitude of the electric current supplied from the photodiode PD, whether or not a proximity detectable object exists in the vicinity of the proximity sensor.

FIG. 20 is a waveform chart illustrating each case where proximity/non-proximity of a proximity detectable object is detected by the proximity sensor of the conventional technique. (a) of FIG. 20 illustrates a case where proximity of a detectable object is detected, and (b) of FIG. 20 illustrates a case where non-proximity of a detectable object is detected. Assuming that a digital signal Dout in a time period during which the light emitting diode LED is driven is Data 1 and a digital signal Dout in a time period during which the light emitting diode LED is not driven is Data 2, a difference between Data 1 and Data 2 (i.e., Data 1−Data 2) becomes proximity data.

As illustrated in (a) of FIG. 20, in a case where the light emitting diode LED is driven when a proximity detectable object exists, reflected light from the proximity detectable object is strong, and accordingly an electric current flowing in the photodiode PD is high. From this, the proximity data (Data 1−Data 2) becomes greater than a threshold Data_th of the control circuit, and thus proximity is determined.

On the other hand, as illustrated in (b) of FIG. 20, in a case where the light emitting diode LED is driven when no proximity detectable object exists, incoming light toward the photodiode PD is weak, and accordingly an electric current flowing in the photodiode PD is low. From this, the proximity data (Data 1−Data 2) does not become greater than the threshold Data_th of the control circuit, and thus non-proximity is determined.

CITATION LIST

Patent Literature

[Patent Literature 1]
Japanese Patent Application Publication Tokukai No. 2006-332226 (Publication date: Dec. 7, 2006)
[Patent Literature 2]
Japanese Patent Application Publication Tokukai No. 2007-305868 (Publication date: Nov. 22, 2007)
[Patent Literature 3]
Japanese Patent Application Publication Tokukai No. 2011-60788 (Publication date: Mar. 24, 2011)

SUMMARY OF INVENTION

Technical Problem

However, the conventional techniques above described have the following problems.

According to the configuration disclosed in Patent Literature 1, the infrared transmissive filter for causing infrared light to pass through is used. This causes a problem that light, which is in an infrared region and is not required for the illuminance sensor, is also received.

According to the configuration disclosed in Patent Literature 2, the spectral characteristic of the light receiving element cannot be changed. This causes a problem that it is impossible to switch between a spectral characteristic required for the illuminance sensor and a spectral characteristic required for the proximity sensor.

According to the configuration disclosed in Patent Literature 3, the illuminance sensor light receiving element and the proximity sensor light receiving element are separately provided, and this causes a problem that the light receiving elements cannot be integrated.

The present invention is accomplished in view of the problems, and its object is to provide a single-unit illuminance/proximity sensor which serves as both (i) an illuminance sensor that can obtain a spectral characteristic near to luminous efficacy by eliminating influence of infrared radiation and (ii) a proximity sensor that can detect proximity of an object by detecting infrared radiation.

Solution to Problem

In order to attain the object, a sensor in accordance with an aspect of the present invention includes: a first light receiving element section which is provided in a substrate, the first light receiving element section having (i) a first visible light receiving P-N junction that has a visible light spectral characteristic and (ii) a first infrared light receiving P-N junction that has an infrared light spectral characteristic; an infrared cut-off filter which is provided so as to cover the first light receiving element section, the infrared cut-off filter removing an infrared component from light; and a first switching section for switching spectral characteristics of the first light receiving element section, the infrared cut-off filter having an opening, and the first infrared light receiving P-N junction being provided at a location deeper in the substrate than the visible light receiving P-N junction.

Advantageous Effects of Invention

According to an aspect of the present invention, it is possible to bring about an effect of providing the single-unit illuminance/proximity sensor which serves as both (i) an illuminance sensor that can obtain a spectral characteristic near to luminous efficacy by eliminating influence of infrared radiation and (ii) a proximity sensor that can detect proximity of an object by causing infrared radiation to pass through.

BRIEF DESCRIPTION OF DRAWINGS

FIG. 8 is a plan view schematically illustrating a plane configuration of the sensor illustrated in FIG. 3.

FIG. 11 is a cross-sectional view illustrating a configuration of an infrared cut-off filter that is made up of a metal multilayer film, in accordance with another embodiment of the present invention.

FIG. 20 is a waveform chart illustrating each case where proximity/non-proximity of a detectable object is detected by a proximity sensor of a conventional technique, and (a) of FIG. 20 illustrates a case where proximity of a detectable object is detected, and (b) of FIG. 20 illustrates a case where non-proximity of a detectable object is detected.

FIG. 21 is a graph indicating spectral characteristics of the sensor illustrated in FIG. 16, in accordance with the conventional technique.

DESCRIPTION OF EMBODIMENTS

The following description will discuss embodiments of the present invention in detail.

Embodiment 1

Figure 1:
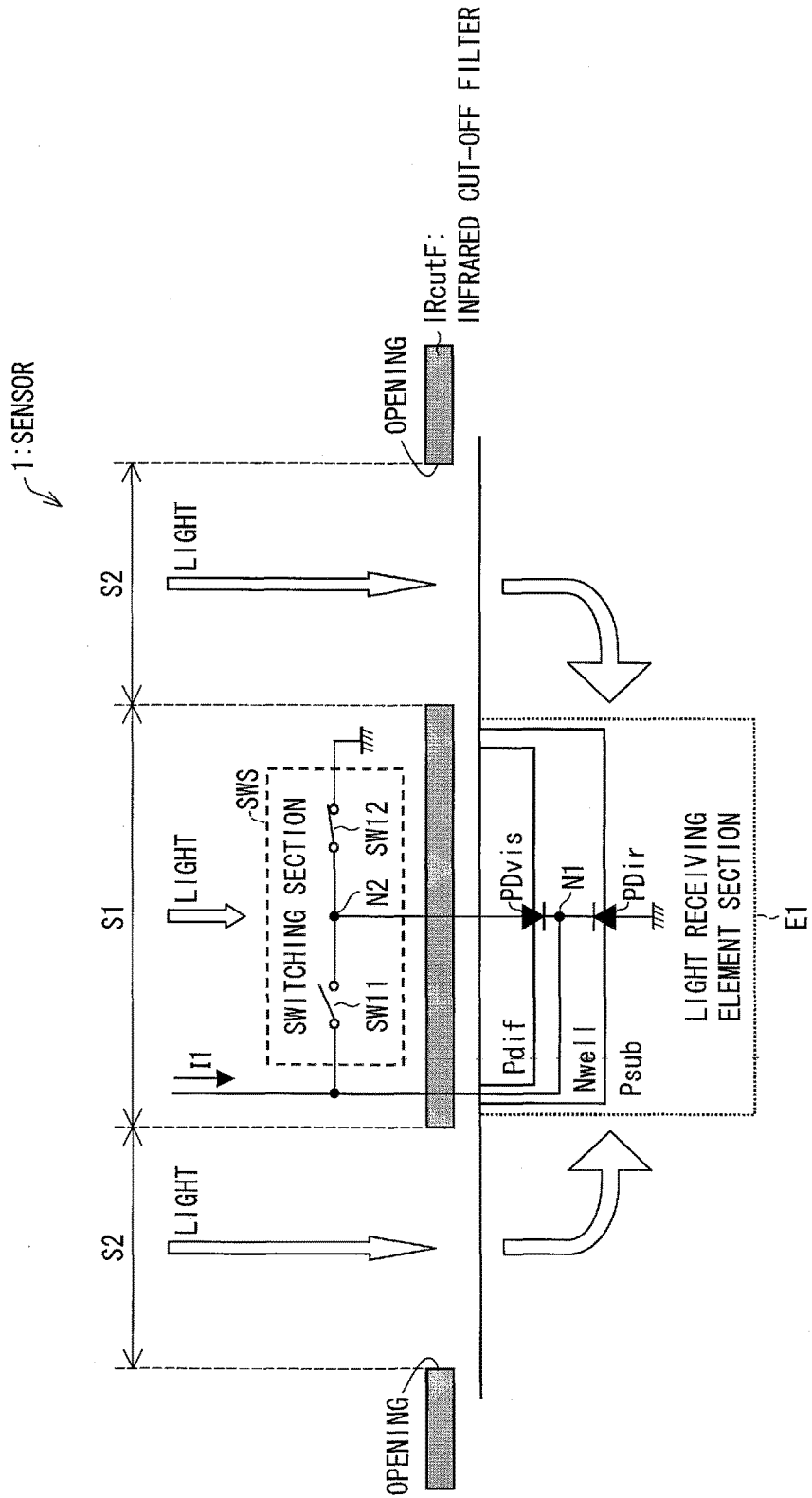
FIG. 1 is a view schematically illustrating a configuration of a sensor in accordance with an embodiment of the present invention.
Figure 2:
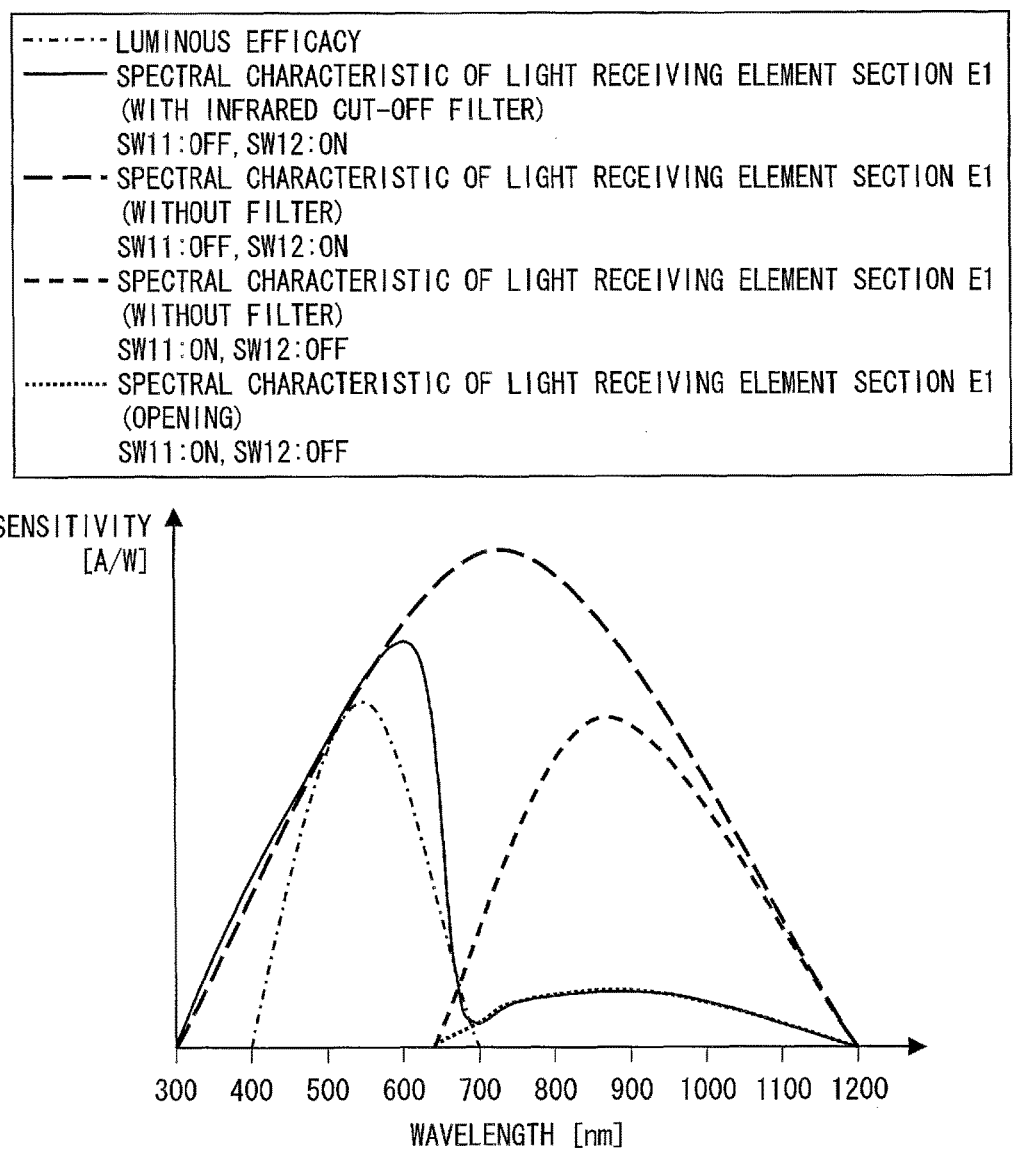
FIG. 2 is a graph indicating spectral characteristics of the sensor illustrated in FIG. 1.
Figure 16:
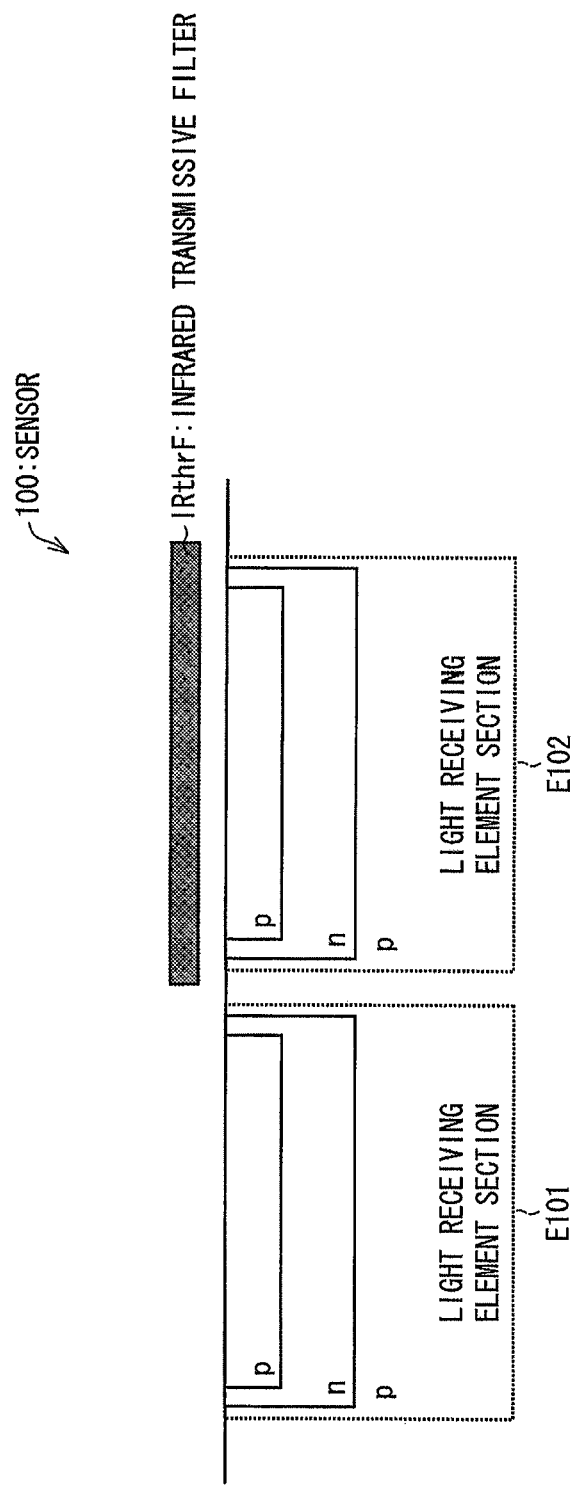
FIG. 16 is a schematic view illustrating a configuration of a sensor in accordance with a conventional technique.
Figure 17:
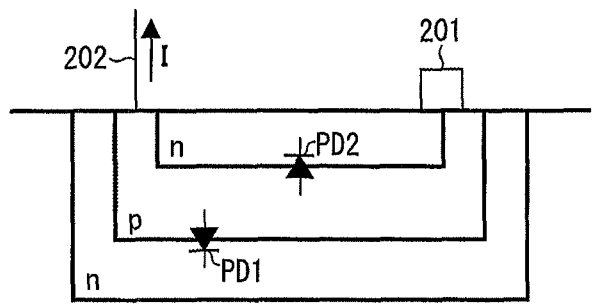
FIG. 17 is a schematic view illustrating a configuration of a light receiving element section in accordance with a conventional technique.
Figure 18:
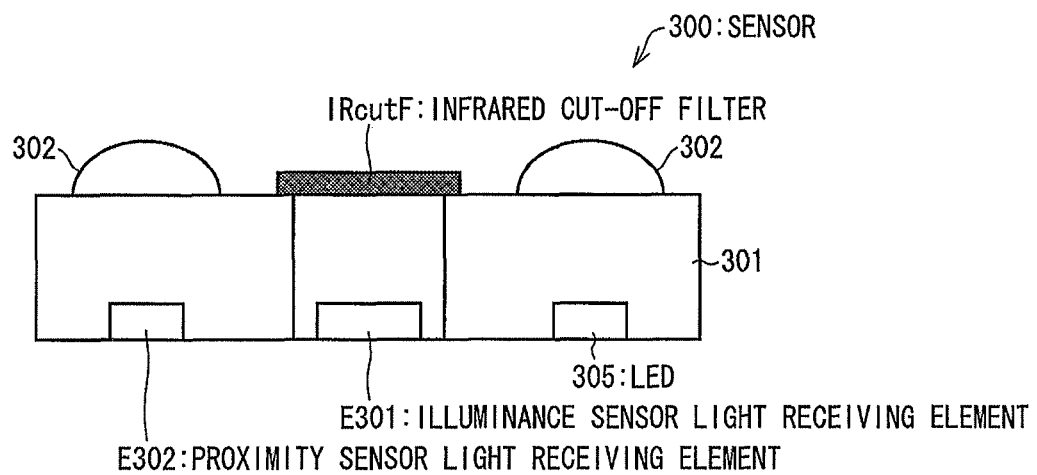
FIG. 18 is a schematic view illustrating a configuration of a sensor in accordance with a conventional technique.
Figure 19:
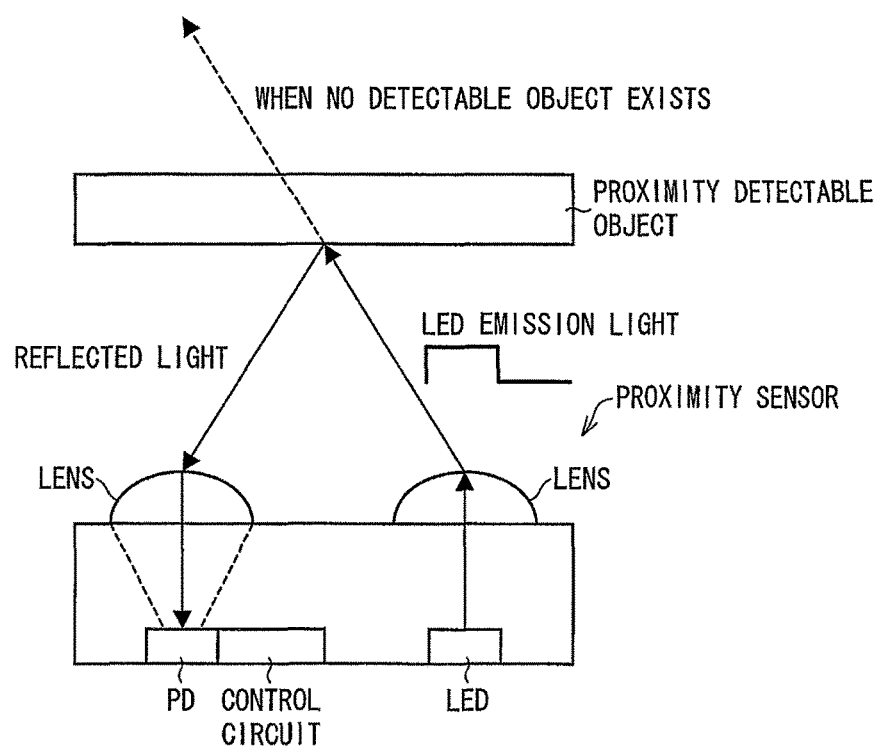
FIG. 19 is a schematic view illustrating a configuration of a general proximity sensor in accordance with a conventional technique.

The following description will discuss an embodiment of the present invention with reference to FIG. 1 and FIG. 2. In the descriptions below, FIG. 16 and FIG. 21 are referred as conventional techniques.

<Configuration and Operation of Sensor 1>

FIG. 1 is a view schematically illustrating a configuration of a sensor 1 in accordance with an embodiment of the present invention. As illustrated in FIG. 1, the sensor 1 includes an infrared cut-off filter IRcutF, a light receiving element section (first light receiving element section) E1, and a switching section SWS.

Here, the sensor 1 includes (i) a visible light detecting section S1 for detecting a visible light component in received light and (ii) an infrared light detecting section S2 for detecting an infrared component in the received light.

In the visible light detecting section S1, the infrared cut-off filter IRcutF and the light receiving element section E1 are arranged in this order in a direction in which light enters the sensor 1.

Note that the switching section SWS is an electrical circuit that is connected with the light receiving element section E1 and does not influence light that enters the sensor 1. Merely for explanation, the switching section SWS is located on a side of the infrared cut-off filter IRcutF on which side light enters. Note, however, that the location of the switching section SWS is not actually limited to this, and the switching section SWS can be provided at any location by arbitrarily providing a connecting wire between the switching section SWS and the light receiving element section E1.

For the infrared light detecting section S2, an opening is provided in the infrared cut-off filter IRcutF.

The following description will discuss details of constituent elements which are provided in the sensor 1.

(Infrared Cut-Off Filter IRcutF)

The infrared cut-off filter IRcutF is a filter for removing an infrared component from light. Here, the infrared cut-off filter IRcutF is provided on a side of the light receiving element section E1 on which side light enters, and the infrared cut-off filter IRcutF thus removes an infrared component from light which is to enter the light receiving element section E1. From this, a photodiode (visible light receiving P-N junction) PDvis provided in the light receiving element section E1 can receive light from which the infrared component has been removed.

The infrared cut-off filter IRcutF has the opening. From this, a photodiode PDir (infrared light receiving P-N junction) provided in the light receiving element section E1 can receive light, from which an infrared component has not been removed, via a path that is indicated by the arrow in the infrared light detecting section S2.

By thus providing the opening in the infrared cut-off filter IRcutF, it is possible to cause parts of the light receiving element section E1 to selectively receive (i) light that does not contain an infrared component and (ii) light that contains an infrared component.

(Light Receiving Element Section E1)

The light receiving element section E1 includes the photodiode PDvis and the photodiode PDir. Specifically, the light receiving element section E1 has a configuration of P-substrate (Psub)-N-well (Nwell)-P-diffusion (Pdif). The photodiode PDvis is formed by a P-N junction of the P-diffusion (Pdif) and the N-well (Nwell), and the photodiode PDir is formed by a P-N junction of the P-substrate (Psub) and the N-well (Nwell).

The photodiode PDvis (i) mainly receives light which has passed through the infrared cut-off filter and (ii) outputs, by photoelectric conversion, an electric current whose amount corresponds to the light thus received. That is, the photodiode PDvis can selectively receive a visible light component contained in light which enters the light receiving element section E1, and an electric current outputted by the photodiode PDvis is to have a magnitude that corresponds to the visible light component of the light which enters the light receiving element section E1.

The photodiode PDir (i) mainly receives light which has passed through the opening in the infrared cut-off filter and (ii) outputs, by photoelectric conversion, an electric current whose amount corresponds to the light thus received. Here, the photodiode PDir and the infrared cut-off filter IRcutF are located on opposite sides of the photodiode PDvis, and therefore the photodiode PDir is to be located deeper than the photodiode PDvis in a direction in which light enters the light receiving element section E1. According to the configuration, light which enters the photodiode PDir is to contain more components of infrared light that can reach a deeper part of an object than visible light can. Therefore, the photodiode PDir can selectively receive infrared light from light which enters the light receiving element section E1. That is, an electric current outputted by the photodiode PDir is to have a magnitude that corresponds to an infrared component of light which enters the light receiving element section E1.

This allows the light receiving element section E1 to obtain a spectral characteristic, which is near to luminous efficacy, i.e., from which influence of infrared radiation has been eliminated, based on an illuminance of visible light which illuminance had been obtained from a current signal outputted by the photodiode PDvis. Moreover, the light receiving element section (i) can detect infrared radiation based on an illuminance of infrared light which illuminance is obtained from a current signal outputted by the infrared light receiving P-N junction, and (ii) can detect proximity of an object.

That is, by having the light receiving element section configured as above described, it is possible to serve as both an illuminance sensor and a proximity sensor.

(Switching Section SWS)

The switching section SWS includes a switch SW11 (first switch) and a switch SW12 (second switch).

Here, a cathode of the photodiode PDvis and a cathode of the photodiode PDir are connected with each other by a connection node (output node) N1. From this, the light receiving element section E1 is to output an electric current I1, which has been obtained by combining, at the connection node N1, a received light current outputted by the photodiode PDvis and a received light current outputted by the photodiode PDir. That is, the connection node N1 serves as an output node of the light receiving element section E1. The switching section SWS can control received light currents, which have been outputted by the respective photodiodes, by switching ON/OFF of each of the switch SW11 and the switch SW12. That is, the switching section SWS can control an electric current which is ultimately outputted from the connection node N1 as an output of the light receiving element section E1. In other words, the spectral characteristic of the light receiving element section E1 can be switched by the switching section SWS.

The following description will discuss details of switching the spectral characteristic of the light receiving element section E1 by the switching section SWS.

(Switch Spectral Characteristic of Light Receiving Element Section E1 by Switching Section SWS)

The switch SW11 has two terminals (i) one of which is connected with the cathode of the photodiode PDvis via the connection node N1 and (ii) the other of which is connected with an anode of the photodiode PDvis via a connection node N2. According to the arrangement, when the switch SW11 is closed, electric potentials at the cathode and the anode of the photodiode PDvis become identical with each other, and therefore no received light current is to be outputted by the photodiode PDvis. From this, only a received light current outputted by the photodiode PDir is to be outputted from the light receiving element section E1. That is, the spectral characteristic of the light receiving element section E1 can be switched to an infrared spectral characteristic.

The switch SW12 has two terminals (i) one of which is connected with the anode of the photodiode PDvis via the connection node N2 and (ii) the other of which is connected with a ground. According to the configuration, when the switch SW12 is closed, the photodiode PDvis generates a potential difference by photoelectric conversion in accordance with received light, and the photodiode PDvis can output a received light current that corresponds to the potential difference. In this case, if the switch SW11 is opened, the light receiving element section E1 is to output an electric current which has been obtained by combining, at the connection node N1, a received light current outputted by the photodiode PDvis and a received light current outputted by the photodiode PDir. That is, it is possible to switch the spectral characteristic of the light receiving element section E1 to a visible-to-infrared spectral characteristic.

That is, by the switching section SWS, it is possible to switch the spectral characteristic of the light receiving element section E1 to any of the infrared spectral characteristic and the visible-to-infrared spectral characteristic.

The following description will discuss how the spectral characteristic changes in accordance with switching by the switching section SWS, with reference to a graph.

(Change in Spectral Characteristic)

FIG. 2 is a graph indicating spectral characteristics of the sensor 1 illustrated in FIG. 1.

First, the following describes that a spectral characteristic can be obtained, which is near to luminous efficacy suitable for an illuminance sensor, by changing the spectral characteristic of the sensor 1.

(Obtain Spectral Characteristic Near to Luminous Efficacy Suitable for Illuminance Sensor)

A dashed dotted line in FIG. 2 indicates a spectral characteristic of luminous efficacy. In a case where the function as the illuminance sensor is needed, the spectral characteristic of the sensor is preferably near to the spectral characteristic of luminous efficacy.

A solid line in FIG. 2 indicates a spectral characteristic of the light receiving element section E1 which is obtained when the switch SW11 is OFF and the switch SW12 is ON in the switching section SWS. In this case, if the infrared cut-off filter IRcutF is not provided, the light receiving element section E1 is to have a visible-to-infrared spectral characteristic indicated by a larger dashed line in FIG. 2. However, in practice, an infrared component of received light is removed by the infrared cut-off filter IRcutF, and therefore the light receiving element section E1 has a visible spectral characteristic.

That is, in the sensor 1, it is possible to change the spectral characteristic of the light receiving element section E1 to the visible spectral characteristic, which is near to luminous efficacy suitable for the illuminance sensor, by the infrared cut-off filter IRcutF and the switching section SWS.

The spectral characteristic thus obtained is nearer to luminous efficacy than, for example, a spectral characteristic which is obtained by the sensor 100 of the conventional technique disclosed in Patent Literature 1.

The following explains that the spectral characteristic of the sensor 1 is nearer to luminous efficacy than a spectral characteristic of a conventional sensor is, with reference to a graph that indicates spectral characteristics of the sensor 100 having a configuration disclosed in Patent Literature 1 (FIG. 16).

(Comparison with Conventional Technique)

FIG. 21 is a graph indicating spectral characteristics of the sensor 100 illustrated in FIG. 16, in accordance with a conventional technique.

In FIG. 21, the dashed line indicates a spectral characteristic of the light receiving element section E101. From this, the light receiving element section E101 has a visible-to-infrared spectral characteristic.

The dotted line in FIG. 21 indicates a spectral characteristic of the light receiving element section E102 for which the infrared transmissive filter IRthrF is provided. From this, the light receiving element section E102, for which the infrared transmissive filter IRthrF is provided, has an infrared spectral characteristic.

The solid line in FIG. 2 indicates a spectral characteristic obtained by subtracting the spectral characteristic of the light receiving element section E102, for which the infrared transmissive filter IRthrF is provided, from the spectral characteristic of the light receiving element section E101. As above described, in order to obtain the spectral characteristic near to luminous efficacy, the sensor 100 is attempting to eliminate influence of infrared light by subtracting an electric current outputted by the light receiving element section E102 from an electric current outputted by the light receiving element section E101.

However, in the sensor 100, the spectral characteristic near to luminous efficacy cannot necessarily be obtained because the subtracting process may cause an error. On the other hand, according to the sensor 1, the subtracting process carried out in the sensor 100 is not needed, and the spectral characteristic near to luminous efficacy is obtained by changing the spectral characteristic by the infrared cut-off filter IRcutF and the switching section SWS. Therefore, the sensor 1 can achieve the spectral characteristic nearer to luminous efficacy than the sensor of the conventional technique.

The following explains that the infrared spectral characteristic suitable for a proximity sensor can be achieved by changing the spectral characteristic of the sensor 1.

(Obtain Infrared Spectral Characteristic Suitable for Proximity Sensor)

The dotted line in FIG. 2 indicates a spectral characteristic of the light receiving element section E1 obtained in a case where the switch SW11 is ON and the switch SW12 is OFF in the switching section SWS. In this case, if the infrared cut-off filter IRcutF is not provided and light does not pass through the opening of the infrared cut-off filter IRcutF, the light receiving element section E1 is to have an infrared spectral characteristic that is indicated by the shorter-dashed line in FIG. 2. In practice, light passes through the opening and infrared light is absorbed before reaching the photo-diode PDir. This causes decrease in sensitivity but still the light receiving element section E1 substantially has an infrared spectral characteristic.

This is because (i) infrared light having a longer wavelength reaches a deeper part in a direction in which light enters the light receiving element section E1 and (ii) infrared light passes through the opening, and this makes it possible to heighten an infrared spectral characteristic and lower a visible spectral characteristic.

That is, according to the sensor 1, the spectral characteristic of the light receiving element section E1 can be changed to an infrared spectral characteristic suitable for a proximity sensor by the switching section SWS and the infrared cut-off filter IRcutF which has the opening.

In a case of providing the proximity sensor function, the visible spectral sensitivity is reduced as above described, and this makes it possible to inhibit malfunction caused by light which is in the visible region and is emitted by a fluorescent lamp or the like.

As above described, by providing the opening in the infrared cut-off filter IRcutF, the sensor 1 brings about the advantageous effect. The following description will discuss a width of the opening with which the effect can be brought about.

(Width of Opening)

The width of the opening is preferably 5 um or greater.

The opening can be provided in the infrared cut-off filter IRcutF by a lift-off method. In the lift-off method, (i) a resist is provided in an area in which an opening is to be provided, (ii) an infrared cut-off filter IRcutF, which is made of a material such as niobium pentoxide ($Nb_2O_5$), is formed over the resist, and then (iii) the resist and a part of the infrared cut-off filter IRcutF, which part is above the resist, are removed. In a case where the lift-off method is used, an infrared cut-off filter having an intended shape can be obtained, provided that a width of the resist is 5 um or greater.

That is, by providing the opening in the infrared cut-off filter IRcutF with, for example, the lift-off method, it is possible to cause the resist, which corresponds to a shape of the opening, to have a width of 5 um or greater, and this makes it possible to obtain the opening having an intended shape.

<Effect of Sensor 1>

According to the sensor 1, the switching section SWS and the infrared cut-off filter IRcutF having the opening make it possible to switch the spectral characteristic of the light receiving element section E1 to any of (i) a visible spectral characteristic near to luminous efficacy suitable for an illuminance sensor and (ii) an infrared spectral characteristic suitable for a proximity sensor.

Moreover, the sensor 1 can achieve a spectral characteristic nearer to luminous efficacy, as compared with conventional techniques.

Embodiment 2

Figure 3:
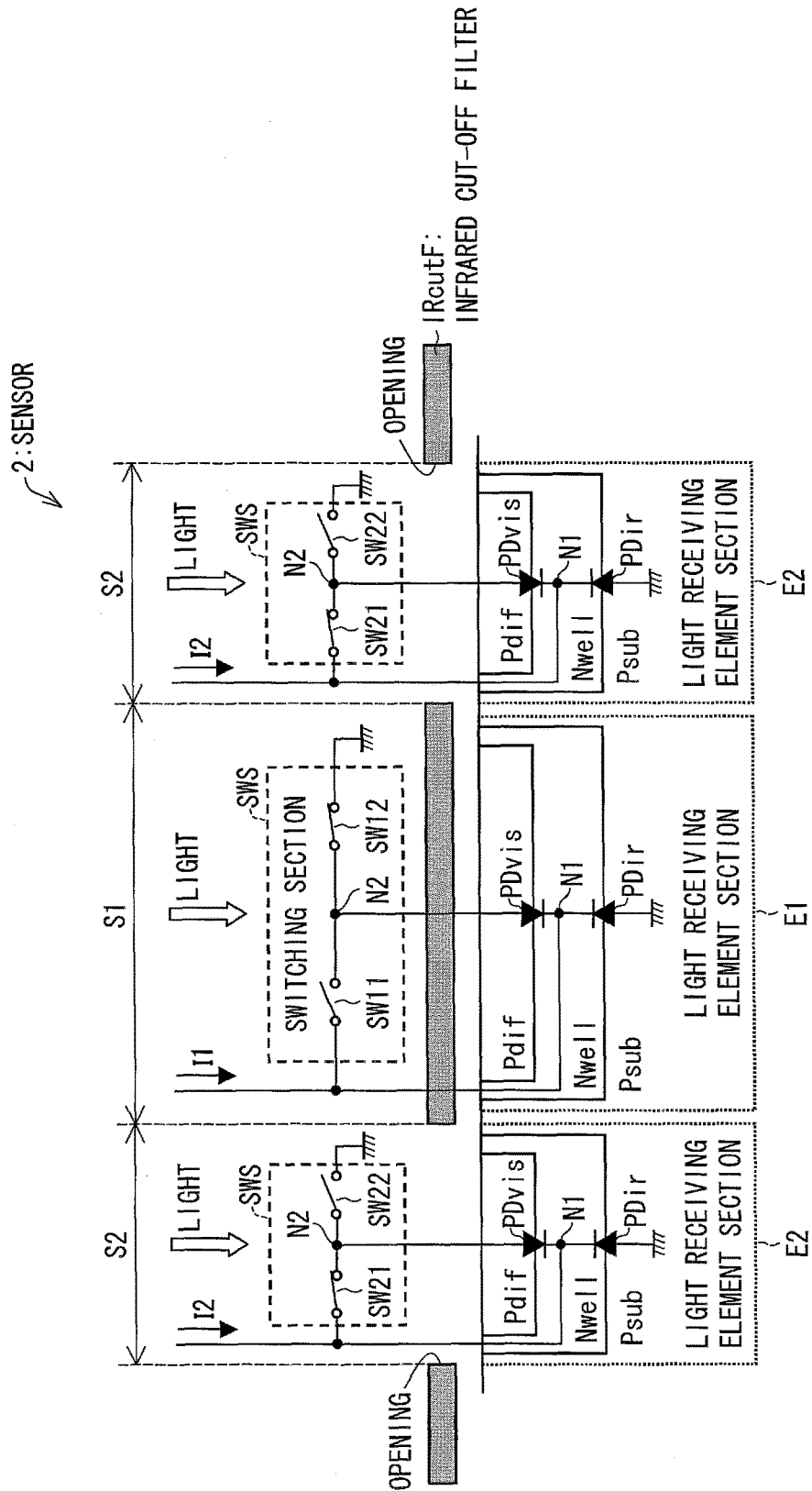
FIG. 3 is a view schematically illustrating a configuration of a sensor in accordance with another embodiment of the present invention.
Figure 4:
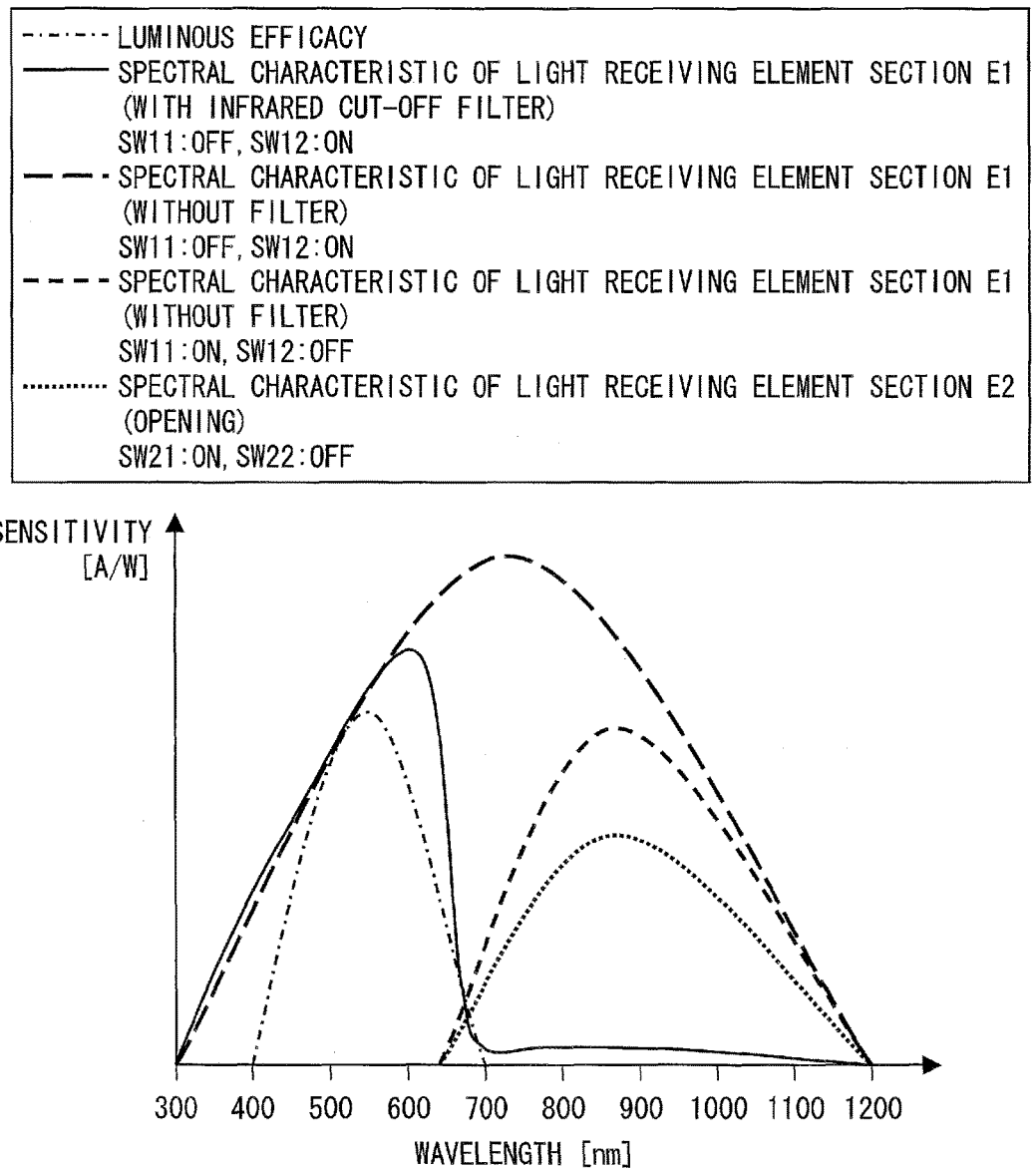
FIG. 4 is a graph indicating spectral characteristics of the sensor 2 illustrated in FIG. 3.

The following description will discuss another embodiment of the present invention with reference to FIG. 3 and FIG. 4. For convenience of explanation, the same reference numerals are given to constituent members which have functions identical with those in the drawings of the above described embodiment, and descriptions regarding such constituent members are omitted.

<Configuration and Operation of Sensor 2>

FIG. 3 is a view schematically illustrating a configuration of a sensor 2 in accordance with another embodiment of the present invention. As illustrated in FIG. 3, the sensor 2 includes two light receiving element sections (second light receiving element section) E2 in addition to the configuration of the sensor 1.

The light receiving element sections E2 are provided at locations at which the light receiving element sections E2 receive light, which has passed through the opening, before the light receiving element section E1 receives the light. Here, the spectral characteristic of the light receiving element section E1 has been switched to a visible-to-infrared spectral characteristic by the switching section SWS. Moreover, a spectral characteristic of the light receiving element sections E2 has been switched to an infrared spectral characteristic by the switching section SWS. Moreover, the light receiving element section E1 outputs an electric current I1, and each of the light receiving element sections E2 outputs an electric current I2. This makes it possible to detect intensity of light, which has been received by each of the light receiving element sections, based on the electric current I1 and the electric currents I2.

Here, each of the light receiving element sections E2 can receive light, which has passed through the opening of the infrared cut-off filter IRcutF and from which an infrared component has not been removed, before the light receiving element section E1 receives the light. Moreover, the spectral characteristic of the light receiving element sections E2 has been switched to the infrared spectral characteristic, and therefore the light receiving element sections E2 can selectively receive infrared light. That is, the light receiving element section E2 can obtain high sensitivity with respect to infrared light. That is, it is possible to provide a proximity sensor having higher sensitivity.

Further, in the light receiving element section E2, visible light is removed by selectively receiving infrared light, and this makes it possible to inhibit malfunction caused by light which is in the visible region and is emitted by a fluorescent lamp or the like.

Moreover, the light receiving element section E1 can receive light whose infrared component has been absorbed by the light receiving element section E2, and therefore the light receiving element section E1 can further selectively receive visible light. That is, the light receiving element section E1 can obtain a spectral characteristic nearer to luminous efficacy. From this, it is possible to provide an illuminance sensor having higher sensitivity.

The following description will discuss how the spectral characteristic changes by switching by the switching section SWS, with reference to a graph.

(Change in Spectral Characteristic)

FIG. 4 is a graph indicating spectral characteristics of the sensor 2 illustrated in FIG. 3.

First, the following describes that a spectral characteristic can be obtained, which is nearer to luminous efficacy more suitable for an illuminance sensor as compared with the sensor 1, by changing the spectral characteristic of the sensor 2.

(Obtain Spectral Characteristic Nearer to Luminous Efficacy Suitable for Illuminance Sensor)

The solid line in FIG. 4 indicates a spectral characteristic of the light receiving element section E1 which is obtained in a case where the switch SW11 is OFF and the switch SW12 is ON in the switching section SWS. In this case, if the infrared cut-off filter IRcutF is not provided, the light receiving element section E1 is to have a visible-to-infrared spectral characteristic indicated by a larger dashed line in FIG. 4. However, in practice, an infrared component of received light is removed by the infrared cut-off filter IRcutF, and therefore the light receiving element section E1 has a visible spectral characteristic.

Moreover, the light receiving element section E1 can receive light whose infrared component has been absorbed by the light receiving element section E2. From this, a sensitivity in a wavelength range from 700 nm to 1200 nm indicated by the solid line in FIG. 4 is lower than a sensitivity in the same wavelength range indicated by the solid line in FIG. 2. That is, in the sensor 2, the infrared component in the received light is removed by the absorption, and it is possible to selectively receive visible light.

That is, according to the sensor 2, it is possible to change, by the infrared cut-off filter IRcutF and the switching section SWS, the spectral characteristic of the light receiving element section E1 to the spectral characteristic that is nearer to luminous efficacy more suitable for an illuminance sensor, as compared with the sensor 1.

The following describes that an infrared spectral characteristic, which is further suitable for a proximity sensor as compared with the sensor 1, can be obtained by changing the spectral characteristic of the sensor 2.

(Obtain Infrared Spectral Characteristic Further Suitable for Proximity Sensor)

The dotted line in FIG. 4 indicates a spectral characteristic of the light receiving element section E2 which is obtained in a case where the switch SW21 is ON and the switch SW22 is OFF in the switching section SWS. In this case, if the infrared cut-off filter IRcutF is not provided and light does not pass through the opening of the infrared cut-off filter IRcutF, the light receiving element section E2 is to have an infrared spectral characteristic that is indicated by the shorter-dashed line in FIG. 4. In practice, light passes through the opening and infrared light is absorbed before reaching the photodiode PDir. This causes decrease in sensitivity but still the light receiving element section E2 has an infrared spectral characteristic for higher sensitivity than the spectral characteristic indicated by the dotted line in FIG. 2.

That is, in the sensor 2, it is possible to change, by the switching section SWS and the infrared cut-off filter IRcutF having the opening, the spectral characteristic of the light receiving element section E1 to an infrared spectral characteristic that is further suitable for a proximity sensor, as compared with the sensor 1.

<Effect of Sensor 2>

The sensor 2 can obtain higher sensitivity with respect to infrared light, as compared with the sensor 1. That is, it is possible to provide a proximity sensor having higher sensitivity.

Moreover, the sensor 2 can obtain a spectral characteristic nearer to luminous efficacy, as compared with the sensor 1. That is, it is possible to provide an illuminance sensor having higher sensitivity.

Moreover, the spectral characteristic of the light receiving element sections E2 can be switched by operation that is identical with that of the light receiving element section E1. Therefore, it is possible to simplify operation of the sensor 2.

Each of the light receiving element sections E2 can have a configuration identical with that of the light receiving element section E1. For example, by employing identical circuit configurations, it is possible to simplify a circuit configuration of the sensor 2. It is therefore possible to simplify a process of manufacturing the sensor 2, and this allows reduction in cost of the sensor 2.

Embodiment 3

Figure 5:
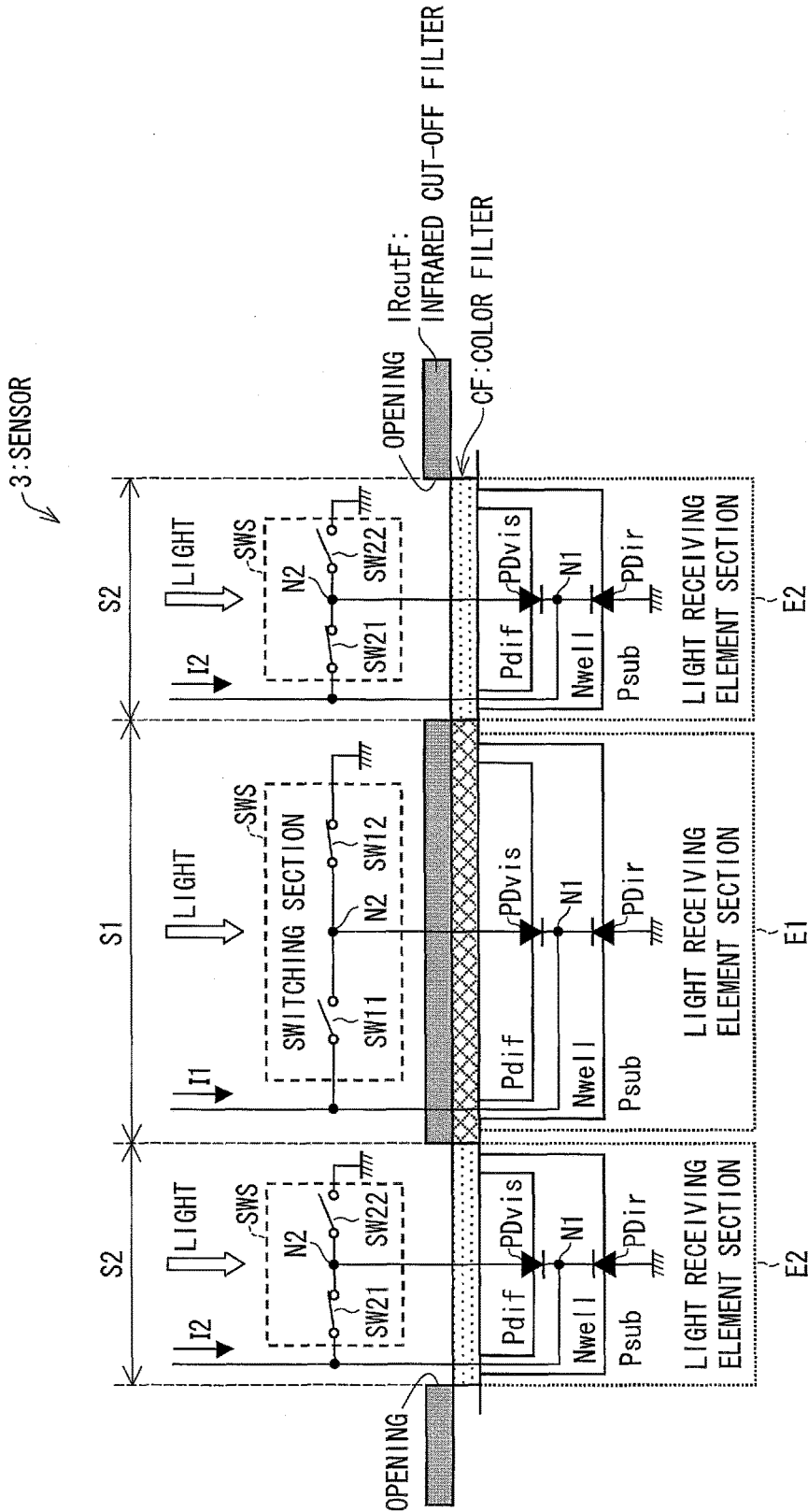
FIG. 5 is a view schematically illustrating a configuration of a sensor in accordance with another embodiment of the present invention.
Figure 6:
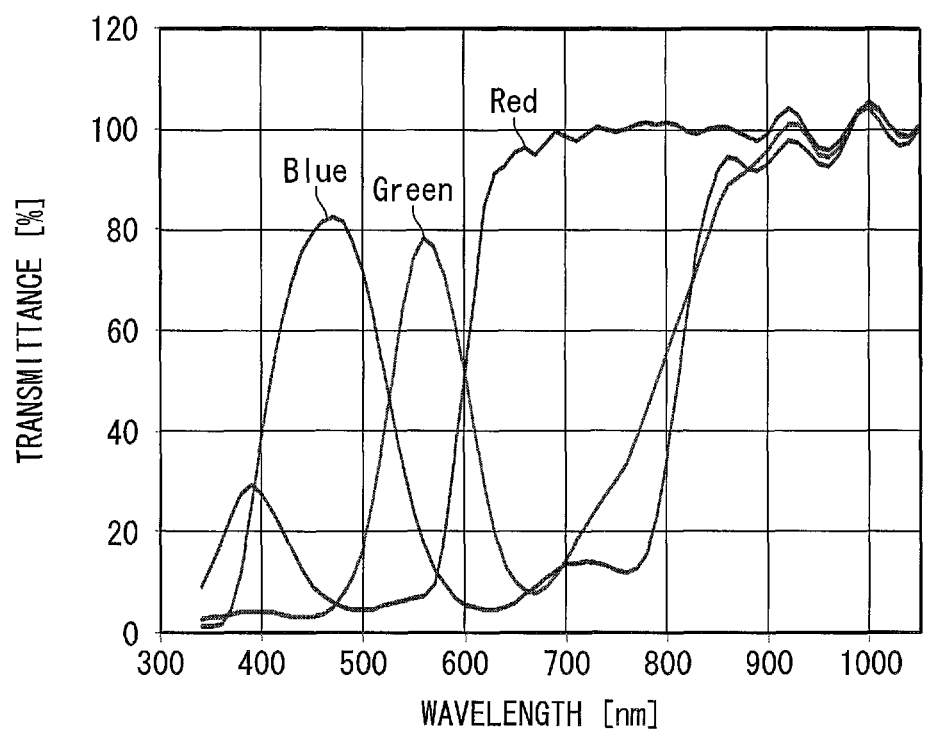
FIG. 6 is a view illustrating transmittances of respective general color filters of R, G, and B.
Figure 7:
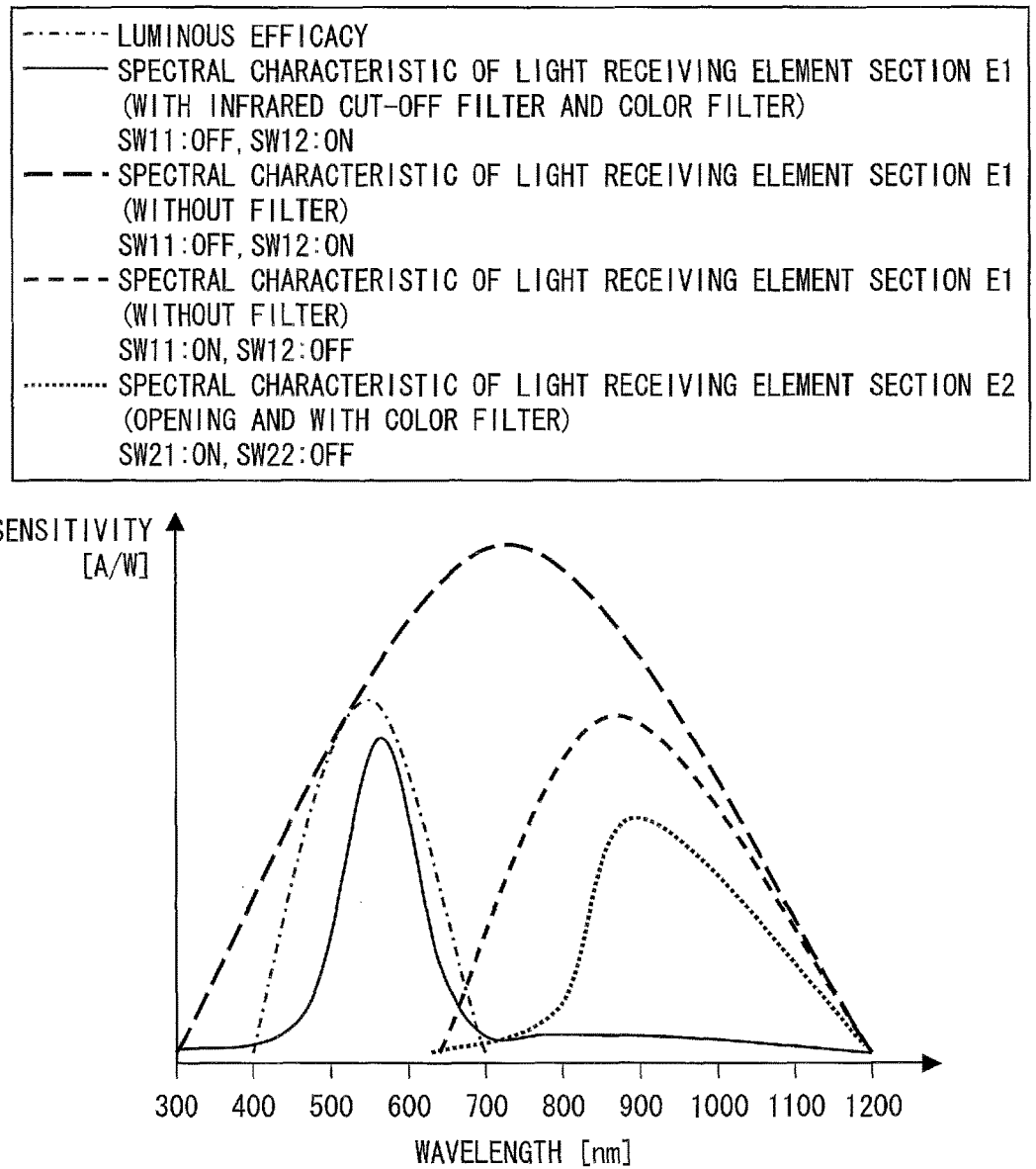
FIG. 7 is a graph indicating spectral characteristics of the sensor illustrated in FIG. 5.

The following description will discuss another embodiment of the present invention with reference to FIGS. 5 through 7. For convenience of explanation, the same reference numerals are given to constituent members which have functions identical with those in the drawings of the above described embodiments, and descriptions regarding such constituent members are omitted.

<Configuration and Operation of Sensor 3>

FIG. 5 is a view schematically illustrating a configuration of a sensor 3 in accordance with another embodiment of the present invention. As illustrated in FIG. 5, the sensor 3 has a color filter CF in addition to the configuration of the sensor 2. Here, a color of the color filter CF can be red, green, or blue. Alternatively, it is possible to provide color filters CF, which have different colors, for the visible light detecting section S1 and the infrared light detecting section S2, respectively.

According to the sensor 3 having the above described configuration, in a case where the sensor 3 needs to serve as an illuminance sensor, the light receiving element section E1 can obtain a spectral characteristic nearer to luminous efficacy by receiving light from which (i) an infrared component has been removed by the infrared cut-off filter and (ii) a visible light component has been selectively extracted by a color filter having a specific color (first specific color filter).

In a case where the sensor 3 needs to serve as a proximity sensor, the light receiving element sections E2 can obtain high sensitivity with respect to infrared light by receiving light from which a visible light component has been selectively removed by a color filter of a specific type (second specific color filter).

The following description will discuss that visible light components can be selectively extracted or removed as above described, with reference to an example in which general color filters of R, G, and B are used.

(General Color Filters of R, G, and B)

FIG. 6 is a view illustrating transmittances of the respective general color filters of R, G, and B. As illustrated in FIG. 6, transmittance distribution of each of the color filters of red, green, and blue is changed depending on wavelengths, and the color filters have respective different distributions.

As illustrated in FIG. 6, a transmittance of the blue color filter in a wavelength range between, for example, 600 nm and 800 nm is lower than those of the other color filters. That is, in a case where the blue color filter is provided so that the light receiving element sections E2 receive light which has passed through the blue color filter, a visible light component in the above wavelength range is selectively removed, and it is therefore possible to obtain a spectral characteristic having higher sensitivity with respect to, for example, infrared light that has a wavelength of 900 nm to 950 nm, as compared with the sensor 2.

The green color filter is known to have a spectral characteristic near to luminous efficacy. That is, in a case where the green color filter is provided so that the light receiving element section E1 receives light which has passed through the green filter, it is possible to obtain a spectral characteristic nearer to luminous efficacy, as compared with the sensor 2.

The following description will discuss how the spectral characteristic changes by switching by the switching section SWS, with reference to a graph.

(Change in Spectral Characteristic)

FIG. 7 is a graph indicating spectral characteristics of the sensor 3 illustrated in FIG. 5.

First, the following describes that a spectral characteristic can be obtained, which is nearer to luminous efficacy further suitable for an illuminance sensor as compared with the sensor 2, by changing the spectral characteristic of the sensor 3.

(Obtain Spectral Characteristic Nearer to Luminous Efficacy Further Suitable for Illuminance Sensor)

The solid line in FIG. 7 indicates a spectral characteristic of the light receiving element section E1 which is obtained in a case where the switch SW11 is OFF and the switch SW12 is ON in the switching section SWS. In this case, if the infrared cut-off filter IRcutF and the color filter CF are not provided, the light receiving element section E1 is to have a visible-to-infrared spectral characteristic indicated by the larger dashed line in FIG. 7. However, in practice, an infrared component of received light is removed by the infrared cut-off filter IRcutF and the color filter CF, and therefore the light receiving element section E1 has a visible spectral characteristic.

Moreover, the light receiving element section E1 can receive light (i) whose infrared component has been removed by the infrared cut-off filter and (ii) whose visible light component has been selectively extracted by the color filter having the specific color. From this, sensitivity in a wavelength range from 400 nm to 700 nm indicated by the solid line in FIG. 7 shows a spectral characteristic that further accords with luminous efficacy, as compared with sensitivity in the same wavelength range indicated by the solid line in FIG. 4.

That is, according to the sensor 3, it is possible to change, by the infrared cut-off filter IRcutF, the color filter CF, and the switching section SWS, the spectral characteristic of the light receiving element section E1 to a spectral characteristic which is nearer to (accords with) luminous efficacy further suitable for an illuminance sensor, as compared with the sensor 2.

The following describes that an infrared spectral characteristic, which is further suitable for a proximity sensor as compared with the sensor 2, can be obtained by changing the spectral characteristic of the sensor 3.

(Obtain Infrared Spectral Characteristic Further Suitable for Proximity Sensor)

The dotted line in FIG. 7 indicates a spectral characteristic of the light receiving element section E2 which is obtained in a case where the switch SW21 is ON and the switch SW22 is OFF in the switching section SWS. In this case, if the infrared cut-off filter IRcutF and the color filter CF are not provided, the light receiving element section E2 is to have an infrared spectral characteristic that is indicated by the shorter-dashed line in FIG. 7. In practice, light passes through the opening and the color filter CF, and infrared light is absorbed before reaching the photodiode PDir, and this causes decrease in sensitivity. However, the light receiving element section E2 has an infrared spectral characteristic for sensitivity that is biased toward an infrared wavelength side than the spectral characteristic indicated by the dotted line in FIG. 4.

That is, according to the sensor 3, it is possible to change, by the color filter CF, the switching section SWS, and the infrared cut-off filter IRcutF having the opening, the spectral characteristic of the light receiving element section E1 to an infrared spectral characteristic that is further suitable for a proximity sensor, as compared with the sensor 2.

<Effect of Sensor 3>

According to the sensor 3, it is possible to obtain an infrared spectral characteristic which is further biased toward the infrared wavelength side, as compared with the sensor 2. That is, it is possible to provide a proximity sensor having higher sensitivity.

Moreover, the sensor 3 can obtain a spectral characteristic nearer to luminous efficacy, as compared with the sensor 2. That is, it is possible to provide an illuminance sensor having higher sensitivity.

Embodiment 4

Figure 9:
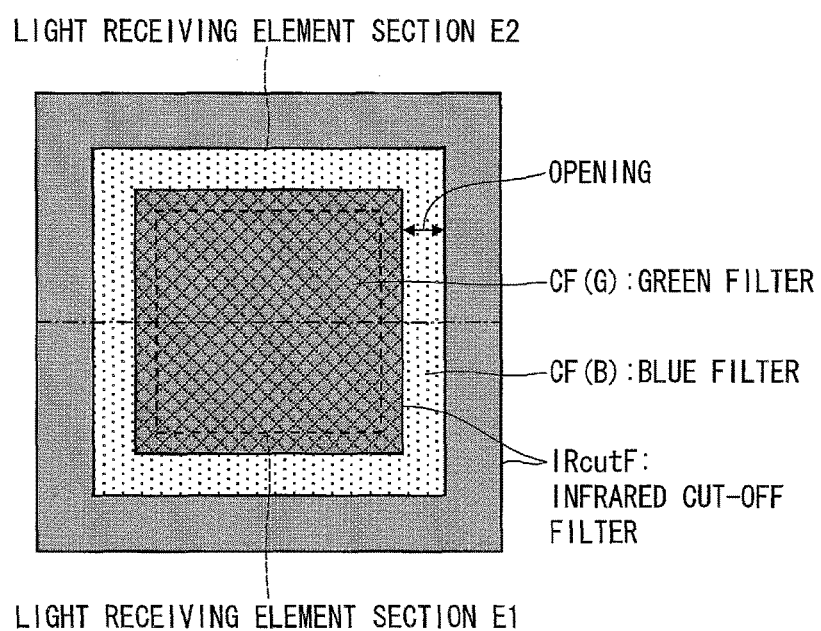
FIG. 9 is a plan view schematically illustrating a plane configuration of the sensor illustrated in FIG. 5.
Figure 10:
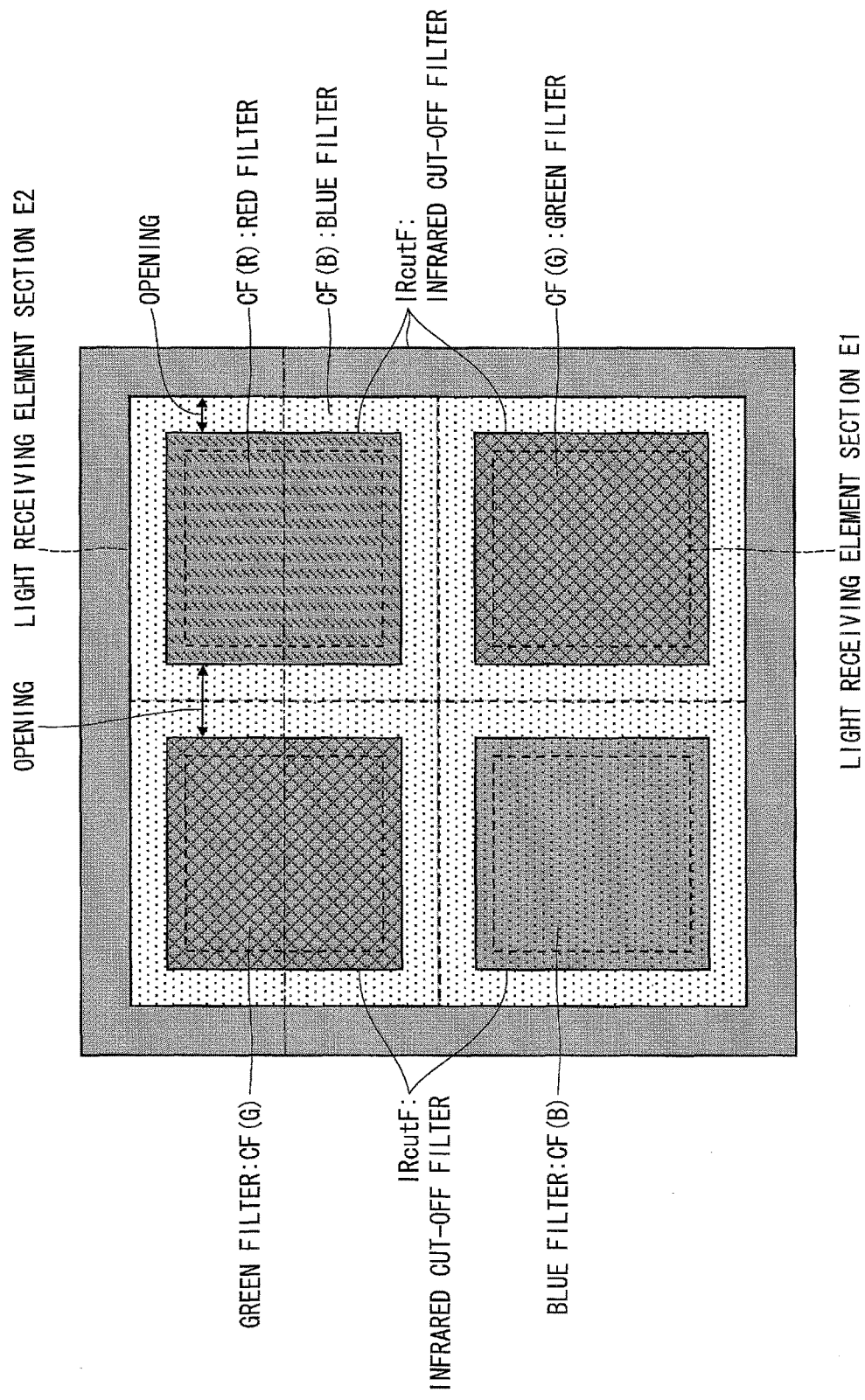
FIG. 10 is a plan view schematically illustrating a plane configuration in which 4 sensors, each of which is illustrated in FIG. 5, are provided.

The following description will discuss another embodiment of the present invention with reference to FIGS. 8 through 10. For convenience of explanation, the same reference numerals are given to constituent members which have functions identical with those in the drawings of the above described embodiments, and descriptions regarding such constituent members are omitted.

FIG. 8 is a plan view schematically illustrating a plane configuration of the sensor 2 illustrated in FIG. 3. As illustrated in FIG. 8, the opening is provided so as to surround an area (indicated by dashed line) in which the photodiode PDvis of the light receiving element section E1 is exposed.

Note that there is an area in which the P-substrate (Psub) is exposed between an area in which the photodiode PDvis of the light receiving element section E1 is exposed and an area in which the photodiode PDvis of the light receiving element section E2 is exposed. Under the circumstances, in consideration of the area in which the P-substrate (Psub) is exposed, the opening can be provided so as to surround an area larger than the area indicated by the dashed line so that the infrared cut-off filter IRcutF does not overlap the area in which the photodiode PDvis of the light receiving element section E2 is exposed.

According to the configuration, in a case where the sensor 2 needs to serve as a proximity sensor, the light receiving element section E2 can efficiently receive infrared light via the opening provided in a whole circumference of the light receiving element section E1. In a case where the sensor 2 needs to serve as an illuminance sensor, the light receiving element section E2 receives and absorbs light, which has passed through the opening, before the light receiving element section E1 receives the light, and it is therefore possible to efficiently inhibit the light receiving element section E1 from receiving the light, which has not passed through the infrared cut-off filter (i.e., the light which has passed through the opening), in the whole circumference of the light receiving element section E1.

FIG. 9 is a plan view schematically illustrating a plane configuration of the sensor 3 illustrated in FIG. 5. As illustrated in FIG. 9, the opening is provided so as to surround an area (indicated by dashed line) in which the photodiode PDvis of the light receiving element section E1 is exposed.

According to the configuration, in a case where the sensor 3 needs to serve as a proximity sensor, the light receiving element section E2 can further efficiently receive, as compared with the sensor 2, infrared light via the opening provided in the whole circumference of the light receiving element section E1. In a case where the sensor 3 needs to serve as an illuminance sensor, the light receiving element section E2 receives and absorbs light, which has passed through the opening, before the light receiving element section E1 receives the light, and it is therefore possible to further efficiently inhibit, as compared with the sensor 2, the light receiving element section E1 from receiving the light, which has not passed through the infrared cut-off filter (i.e., the light which has passed through the opening), in the whole circumference of the light receiving element section E1.

FIG. 10 is a plan view schematically illustrating a plane configuration in which four sensors 3, each of which is illustrated in FIG. 5, are provided. As illustrated in FIG. 10, the opening is provided so as to surround an area (indicated by dashed line) in which the photodiode PDvis of the light receiving element section E1 is exposed.

By thus combining light receiving element sections having any of a red filter CF(R), a green filter CF(G), and a blue filter CF(B), it is possible to achieve a spectral characteristic of three primary colors, i.e., red, green, and blue. This makes it possible to provide an RGB color sensor that can serve as a proximity sensor.

Embodiment 5

The following description will discuss another embodiment of the present invention with reference to FIG. 11. For convenience of explanation, the same reference numerals are given to constituent members which have functions identical with those in the drawings of the above described embodiments, and descriptions regarding such constituent members are omitted.

FIG. 11 is a cross-sectional view illustrating a configuration of an infrared cut-off filter IRcutF made up of a metal multilayer film, in accordance with another embodiment of the present invention. As illustrated in FIG. 11, the infrared cut-off filter IRcutF made up of the metal multilayer film has a configuration in which 20 to 40 alternate layers of niobium pentoxide ($Nb_2O_5$) and silicon oxide ($SiO_2$) are stacked. Here, niobium pentoxide (i) transmits light whose wavelength is from near-ultraviolet wavelength to infrared wavelength and (ii) has low stress. Therefore, niobium pentoxide is used to form a film by vapor deposition or sputtering. As such, a film of niobium pentoxide can be formed on the light receiving element in a process of manufacturing a semiconductor.

Moreover, the metal multilayer film having the above described configuration can select, by utilizing interference of light, a wavelength of light to transmit. Therefore, the metal multilayer film is suitable for the infrared cut-off filter IRcutF.

Embodiment 6

Figure 12:
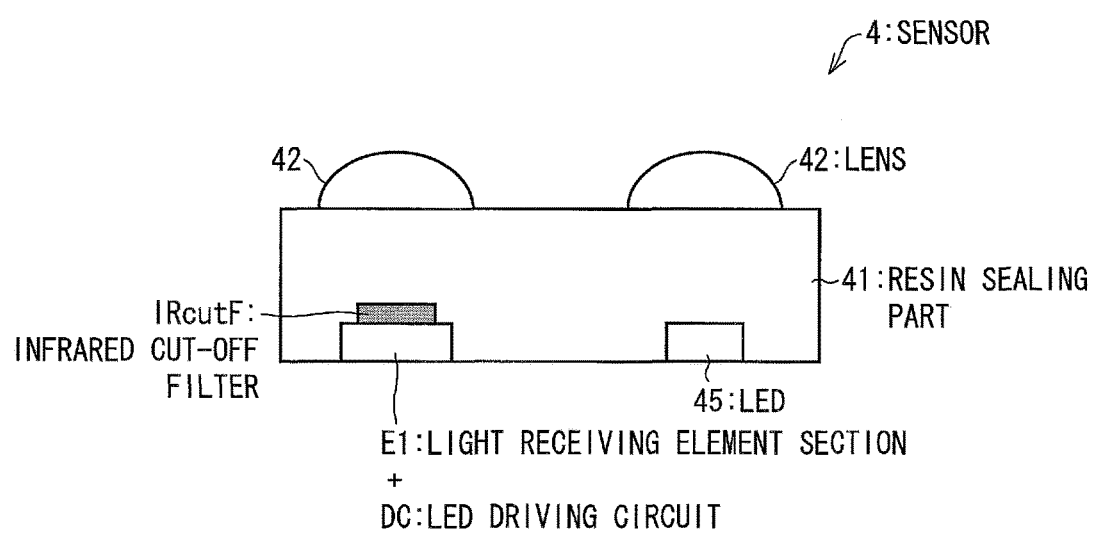
FIG. 12 is a view schematically illustrating a configuration of a sensor in accordance with another embodiment of the present invention.

The following description will discuss another embodiment of the present invention with reference to FIG. 12. For convenience of explanation, the same reference numerals are given to constituent members which have functions identical with those in the drawings of the above described embodiments, and descriptions regarding such constituent members are omitted.

FIG. 12 is a view schematically illustrating a configuration of a sensor 4 in accordance with another embodiment of the present invention. As illustrated in FIG. 12, the sensor 4 includes a resin sealing part 41, a light receiving element section E1, a light emitting diode (LED) driving circuit DC, an infrared cut-off filter IRcutF, and an LED 45. Here, lenses (lens part) 42 are provided on a part of a surface of the resin sealing part, which surface faces the light receiving element section E1. Moreover, the light receiving element section E1 and the LED driving circuit DC are integrated. Note that, if needed, a switching section SWS (not illustrated) can be provided, and/or an opening (not illustrated) can be provided in the infrared cut-off filter IRcutF.

Here, the lenses 42 converge light, which has entered the lenses 42, onto the light receiving element section E1. Moreover, relative locations of the lenses 42 and the light receiving element section E1 are fixed by sealing the light receiving element section E1 with the resin sealing part 41.

That is, the light receiving element section E1 that serves as an illuminance sensor and a proximity sensor is sealed by the resin sealing part 41, and the lenses 42 which are provided on a part of the surface of the resin sealing part 41 converge light. According to the configuration, the relative locations of the light receiving element section E1 and the lenses 42 are fixed, and this allows the light receiving element section E1 to accurately receive light even when a size of the light receiving element section. E1 is reduced. That is, by reducing the size of the light receiving element section E1 and integrating the light receiving element section E1 with the resin sealing part 41 that has the lenses 42 on a part of its surface, it is possible to reduce a size of the entire sensor 4, and this makes it possible to provide a small single-unit illuminance/proximity sensor.

Moreover, the light receiving element section E1 receives light which has been emitted by the LED 45 and then reflected by an object. Note that the process, during which the light is reflected by the object and is then received, is carried out in accordance with a principle similar to that of a conventional technique.

From this, while the LED 45 is not being driven by the LED driving circuit DC, the sensor 4 can serve as an illuminance sensor. Meanwhile, while the LED 45 is driven by the LED driving circuit DC, the sensor 4 detects light which has been emitted by the LED 45 and then reflected by an object proximate to the sensor 4, and thus the sensor 4 serves as a proximity sensor. It is therefore possible to provide the single-unit illuminance/proximity sensor.

In the descriptions below, details of an analog-digital converting circuit which receives a signal outputted by each of the sensors having the above described configuration (specifically, the light receiving element section in each of the sensors) and carries out analog-digital conversion of the signal.

Embodiment 7

Figure 13:
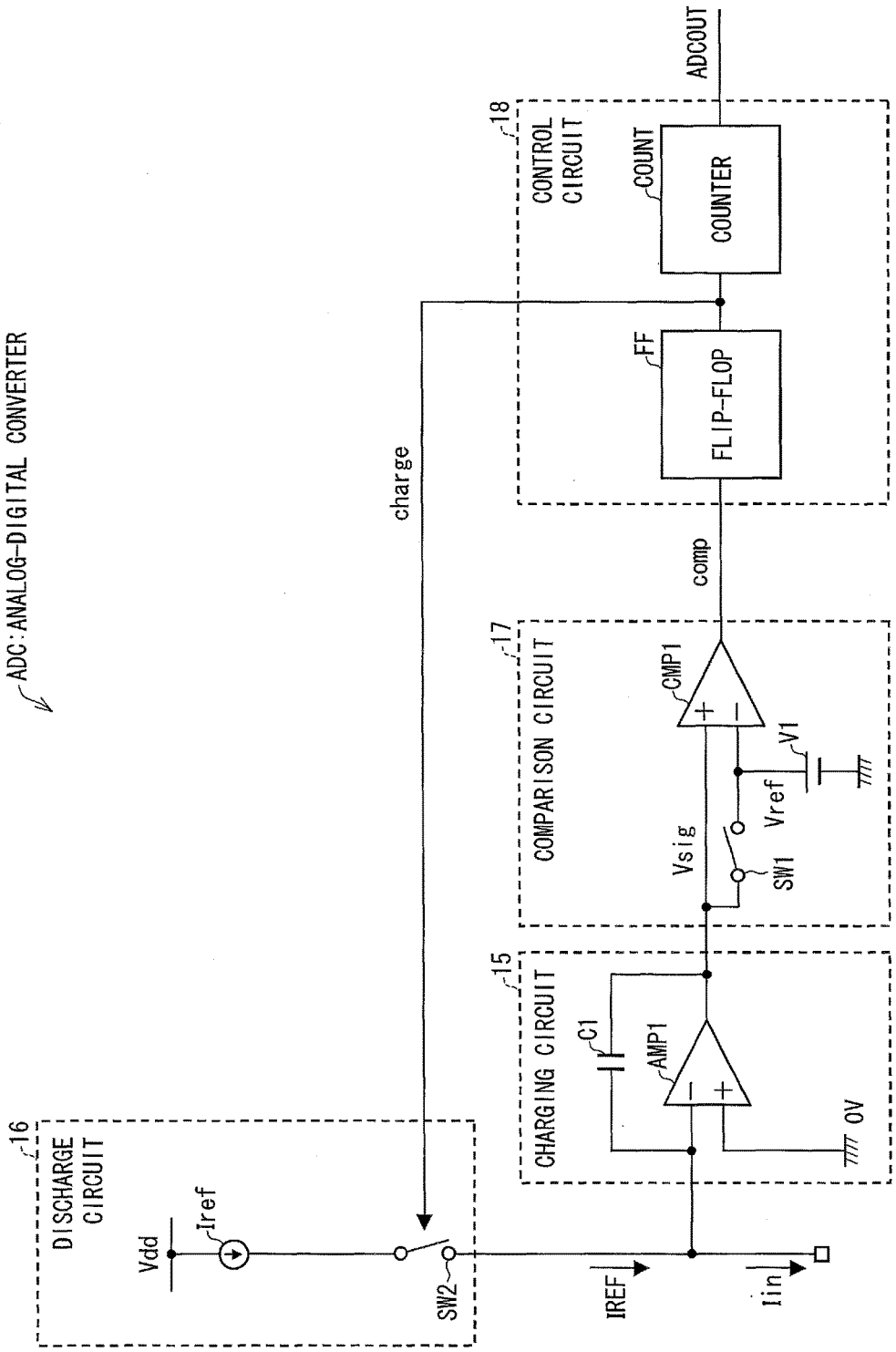
FIG. 13 is a view illustrating a configuration of an analog-digital converting circuit in accordance with another embodiment of the present invention.
Figure 14:
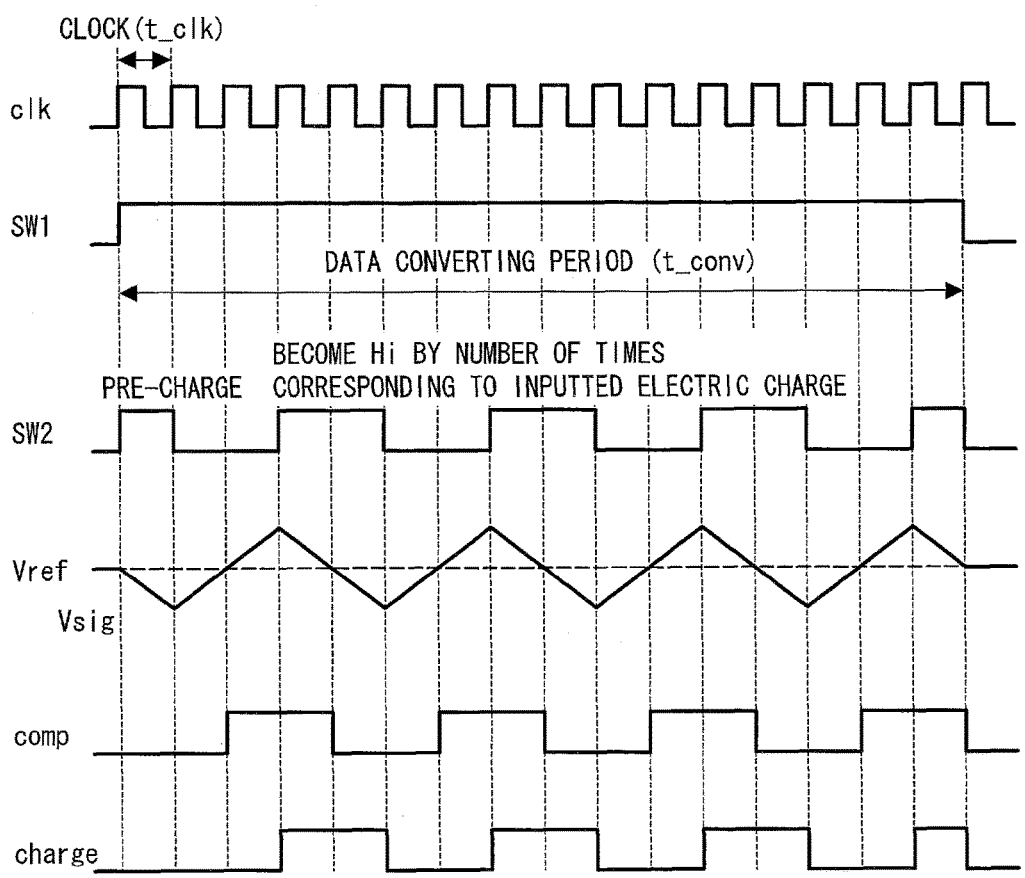
FIG. 14 is a waveform chart illustrating operation of the analog-digital converting circuit illustrated in FIG. 13.

The following description will discuss another embodiment of the present invention with reference to FIGS. 13 and 14. For convenience of explanation, the same reference numerals are given to constituent members which have functions identical with those in the drawings of the above described embodiments, and descriptions regarding such constituent members are omitted.

(Configuration of Analog-Digital Converting Circuit ADC)

FIG. 13 is a view illustrating a configuration of an analog-digital converting circuit ADC in accordance with another embodiment of the present invention. As illustrated in FIG. 13, the analog-digital converting circuit ADC includes a charging circuit (integrating circuit) 15, a discharge circuit 16, a comparison circuit 17, and a control circuit (output circuit) 18. The following description will discuss details of the constituent elements of the analog-digital converting circuit ADC.

(Charging Circuit 15)

The charging circuit 15 includes an amplifier AMP1 and a capacitor (integrating capacitor) C1 which constitute an integrator. In the capacitor C1, an electric charge is stored whose amount corresponds to an input current Iin.

(Discharge Circuit 16)

The discharge circuit 16 includes (i) a power source Vdd, (ii) a reference current source Iref for generating a reference current IREF which is used to discharge an electric charge stored in the capacitor C1, and (iii) a switch SW2 for switching ON/OFF of discharge.

(Comparison Circuit 17)

The comparison circuit 17 includes a comparator CMP1 and a switch SW1. The comparator CMP1 compares an output voltage Vsig of the charging circuit 15 and a reference voltage Vref supplied by a reference voltage source V1, and outputs an output signal comp.

Moreover, based on ON/OFF of the switch SW1, a data converting period is determined in which an input current Iin is converted into a digital value ADCOUT.

When the switch SW1 has been ON, the reference voltage source V1 is connected to the charging circuit 15 and the reference voltage Vref is supplied to the capacitor C1 so that the capacitor C1 is charged. When the switch SW1 has been OFF, the output voltage Vsig of the charging circuit 15 is compared with the reference voltage Vref by the comparator CMP1. An output signal comp indicating a result of the comparison is inputted to the control circuit as a binary (i.e., "High" and "Low") pulse signal. An input current Iin which is inputted while the switch SW1 is OFF is converted into a digital value ADCOUT.

(Control Circuit 18)

The control circuit 18 includes a flip-flop FF and a counter COUNT. The flip-flop FF latches an output signal comp of the comparison circuit 17. From this, bit stream signals charge are inputted to the discharge circuit 16 and the counter COUNT, respectively. Here, the counter COUNT counts the number of LOW levels of the bit stream signal charge (i.e., the number of discharges). That is, the counter COUNT counts active pulses. Moreover, the counter COUNT outputs a result of the count as a digital value ADCOUT which is an analog-digital converted value corresponding to the input current Iin.

Here, the switch SW2 of the discharge circuit 16 is switched ON/OFF based on the bit stream signal charge. When the switch SW2 of the discharge circuit 16 has been set to ON, an electric charge is supplied from the discharge circuit 16 to the capacitor C1 of the charging circuit 15. When the switch SW2 has been set to OFF, the electric charge of the capacitor C1 of the charging circuit 15 is discharged in accordance with an input current Iin.

The following description will discuss operation of the analog-digital converting circuit ADC having the above described configuration.

(Operation of Analog-Digital Converting Circuit ADC)

FIG. 14 is a waveform chart indicating operation of the analog-digital converting circuit ADC illustrated in FIG. 13.

When a High-level signal has been inputted to the switch SW1, the switch SW1 is set to OFF, and then conversion of an input current Iin into a digital value ADCOUT starts.

When a High-level signal has been inputted to the switch SW2, the switch SW2 is set to OFF, and then an electric charge stored in the capacitor C1 of the charging circuit 15 is discharged in accordance with the input current Iin (pre-charge operation). From this, an output voltage Vsig of the charging circuit 15 decreases. The output voltage Vsig of the charging circuit 15 is first set to be identical with the reference voltage Vref, and therefore the output voltage Vsig of the charging circuit becomes lower than the reference voltage Vref in this period.

Subsequently, when a Low-level signal has been inputted to the switch SW2, the switch SW2 is set to ON, and an electric charge is supplied from the discharge circuit 16 to the capacitor C1 of the charging circuit 15. From this, the output voltage Vsig of the charging circuit 15 increases. At a certain time point, the output voltage Vsig of the charging circuit 15 becomes higher than the reference voltage Vref. The output voltage Vsig of the charging circuit 15 and the reference voltage Vref are compared by the comparator CMP1, and when the output voltage Vsig of the charging circuit 15 has become higher than the reference voltage Vref, a High-level output signal comp is outputted by the comparator CMP1.

When the High-level output signal comp has been inputted to the flip-flop FF of the control circuit 18, the flip-flop FF latches the output signal comp, and then the flip-flop FF outputs a High-level bit stream signal charge at a next rising edge of a clock signal clk.

When the High-level bit stream signal charge has been inputted to the switch SW2, the switch SW2 is set to OFF, and then the electric charge stored in the capacitor C1 of the charging circuit 15 is discharged. From this, the output voltage Vsig of the charging circuit 15 decreases. At a certain time point, the output voltage Vsig of the charging circuit 15 becomes lower than the reference voltage Vref. When the output voltage Vsig of the charging circuit 15 has become lower than the reference voltage Vref, a Low-level output signal comp is outputted as an active pulse which indicates that an output of the comparator CMP1 is at an active level. Note that the active pulse can be set to any of the Low-level and the High-level, and can be selected as appropriate in accordance with an operation logic of the circuit.

When a Low-level output signal comp has been inputted to the flip-flop FF of the control circuit 18, the flip-flop FF latches the output signal comp and thus the control circuit 18 takes in the output signal comp. The flip-flop FF outputs a Low-level bit stream signal charge at a next rising edge of the clock signal clk.

When the Low-level bit stream signal charge has been inputted to the switch SW2, the switch SW2 is set to ON. Here, in the bit stream signal charge, Low-level signals (active pulses) are arranged in time series, and the switch SW2 is ON during a Low-level period (active pulse period).

The analog-digital converting circuit ADC repeats the operation as above described, and the counter COUNT, which has counted the number of discharges count of the discharge circuit 16 while the switch SW1 is OFF, i.e., during a data converting period t_conv, can output a digital value ADCOUT corresponding to the input current Iin.

Here, assuming that a cycle of the clock signal clk is "t_clk", an amount of an electric charge charged by the input current Iin during the data converting period t_conv is as follows:

$$Iin \times t\_conv$$

An amount of an electric charge discharged at one time by the reference current IREF flowing in the discharge circuit 16 is as follows:

$$IREF \times t\_clk$$

The charged amount of electric charge Iin×t_conv is equal to a total of discharged amounts of electric charge during the data converting period t_conv, that is:

$$Iin \times t\_conv = IREF \times t\_clk \times count \qquad (1)$$

From the formula (1) above, $$count = (Iin \times t\_conv)/(IREF \times t\_clk) \qquad (2)$$

is derived.

A limiting resolution of the analog-digital converting circuit ADC is determined by (IREF×t_clk). Here, assuming that the limiting resolution is "n", a charging period t_conv is set to:

$$t\_conv = t\_clk \times 2^n \qquad (3)$$

and the following is derived, that is:

$$count = (Iin/IREF) \times 2^n \qquad (4)$$

For example, in a case where resolution n=16 bits, a counter COUNT is to output a value in a range from 0 to 65535 in accordance with an input current Iin. From this, the integral analog-digital converting circuit ADC can achieve a wide dynamic range and can carry out high resolution analog-digital conversion. Moreover, the integral analog-digital converting circuit ADC configured as such is suitable for an illuminance sensor and a proximity sensor.

MAIN POINTS OF PRESENT EMBODIMENT

As above described, a digital value is obtained by carrying out, by the analog-digital converting circuit ADC, analog-digital conversion with respect to an input current Iin which is an electric current outputted by each of the sensors above described. By utilizing such a digital value, it is possible to calculate a color temperature or an illuminance with high accuracy by a low-cost configuration.

Moreover, according to the analog-digital converting circuit ADC illustrated in FIG. 13, it is possible to set an input voltage to a non-inverting input terminal of the amplifier AMP1 to 0 V. This makes it possible to set a terminal voltage (bias voltage) of the above described photodiode (PDvis, PDir) to be 0 V. Therefore, it is possible to reduce a dark current of the photodiode and to accurately measure even low-intensity light. That is, it is possible to accurately measure with low sensitivity.

Embodiment 8

Figure 15:
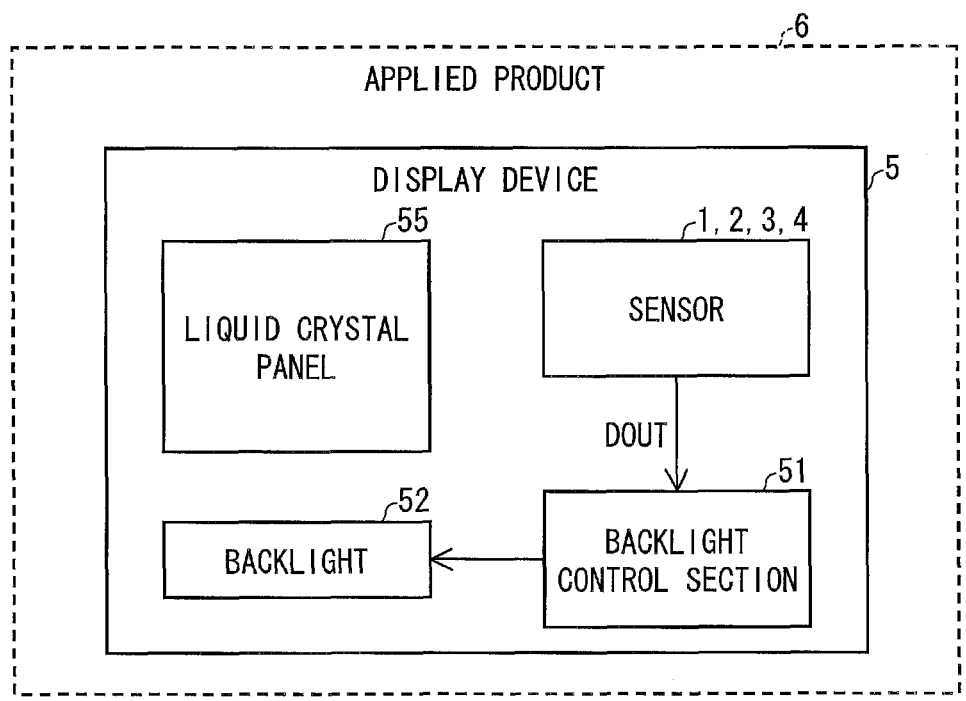
FIG. 15 is a block diagram schematically illustrating a configuration of a display device 5 in accordance with another embodiment of the present invention.

The following description will discuss another embodiment of the present invention with reference to FIG. 15. For convenience of explanation, the same reference numerals are given to constituent members which have functions identical with those in the drawings of the above described embodiments, and descriptions regarding such constituent members are omitted.

(Display Device 5)

FIG. 15 is a block diagram schematically illustrating a configuration of a display device 5 in accordance with another embodiment of the present invention. The display device 5 includes sensors 1 through 4, a backlight control section 51, a backlight 52, and a liquid crystal panel 55.

The backlight 52 is a light source for emitting light from a rear surface toward the liquid crystal panel 55 that displays a screen. The backlight 52 includes, for example, a red LED, a green LED, and a blue LED. The sensors 1 through 4 receive ambient light around the display device 5 and measure color components of the ambient light. Moreover, the sensors 1 through 4 output a digital signal DOUT to the backlight control section 51 as a result of the measurement. The backlight control section 51 carries out arithmetical operation based on the digital signal DOUT so as to calculate a color component and an illuminance. Based on information thus calculated, luminances of respective of the red LED, the green LED, and the blue LED of the backlight 52 are controlled, and this makes it possible to control colors or a luminance of the backlight 52 in accordance with the color components of the ambient light.

For example, in a case where an illuminance of ambient light is high, the backlight control section 51 controls the backlight 52 to have a higher luminance and, in a case where an illuminance of ambient light is low, the backlight control section 51 controls the backlight 52 to have a lower luminance. This makes it possible to (i) reduce power consumption of the backlight 52 and (ii) accurately control a tinge of the liquid crystal panel 55 to correspond to chromatic adaptation of eyes.

Moreover, the display device 5 can accurately detect proximity of a nearby object by the sensors 1 through 4, and this makes it possible to control a luminance of the backlight 52 in accordance with proximity of a nearby object. The display device 5 configured as such is suitable for a mobile telephone or a digital still camera which includes a display panel like the liquid crystal panel 55.

Note that the signal outputted from the sensors 1 through 4 can be converted by the above described analog-digital converting circuit ADC. In such a case, the backlight control section 51 can control a luminance of the backlight 52 based on the output signal thus converted.

Alternatively, the display device 5 can be used in another product as a part of an applied product (mobile telephone, digital camera) 6.

[Main Points]

The sensor in accordance with an aspect 1 of the present invention includes: a first light receiving element section which is provided in a substrate, the first light receiving element section having (i) a first visible light receiving P-N junction that has a visible light spectral characteristic and (ii) a first infrared light receiving P-N junction that has an infrared light spectral characteristic; an infrared cut-off filter which is provided so as to cover the first light receiving element section, the infrared cut-off filter removing an infrared component from light; and a first switching section for switching spectral characteristics of the first light receiving element section, the infrared cut-off filter having an opening, and the first infrared light receiving P-N junction being provided at a location deeper in the substrate than the visible light receiving P-N junction.

According to the configuration, the first visible light receiving P-N junction receives light from which an infrared component has been removed by passing through the infrared cut-off filter. This allows the first visible light receiving P-N junction to selectively receive a visible light component in light entering the first light receiving element section.

Moreover, the first infrared light receiving P-N junction receives light which has passed through the opening provided in the infrared cut-off filter. Further, the first infrared light receiving P-N junction is provided at a location deeper than the first visible light receiving P-N junction. According to the configuration, light which enters the first infrared light receiving P-N junction is to contain more components of infrared light that can reach a deeper part of an object than visible light can reach. Therefore, the first infrared light receiving P-N junction can selectively receive infrared light from light which enters the first light receiving element section.

As such, the first light receiving element section can obtain a spectral characteristic, from which influence of infrared radiation has been eliminated and which is near to luminous efficacy, based on an illuminance of visible light, which illuminance had been obtained from a current signal outputted by the first visible light receiving P-N junction. Moreover, the first light receiving element section (i) can detect infrared radiation based on an illuminance of infrared light which illuminance is obtained from a current signal outputted by the first infrared light receiving P-N junction, and (ii) can detect proximity of an object. That is, by having the first light receiving element section configured as above described, it is possible to serve as both an illuminance sensor and a proximity sensor.

Further, the switching section can switch spectral characteristics of the first light receiving element section. This makes it possible to arbitrarily select a function as the illuminance sensor or a function as the proximity sensor.

That is, it is possible to provide the single-unit illuminance/proximity sensor which can serve as both (i) an illuminance sensor that can obtain a spectral characteristic near to luminous efficacy from which influence of infrared radiation has been eliminated and (ii) a proximity sensor that can detect proximity of an object by detecting infrared radiation.

According to the sensor in accordance with an aspect 2 of the present invention, in the aspect 1, the opening can be provided in the infrared cut-off filter so as to surround the first light receiving element section.

According to the configuration, it is possible to efficiently receive infrared light via the opening provided in a whole circumference of the first light receiving element section.

According to the sensor in accordance with an aspect 3 of the present invention, in the aspect 1 or 2, the first switching section can switch a spectral characteristic of the first light receiving element section to an infrared spectral characteristic or a visible-to-infrared spectral characteristic.

According to the configuration, in a case where the sensor needs to serve as an illuminance sensor, (i) the spectral characteristic of the first light receiving element section is switched to a visible-to-infrared spectral characteristic which is suitable for receiving visible light and also (ii) the infrared cut-off filter is used, and this makes it possible to obtain a spectral characteristic near to luminous efficacy as the entire sensor, and thus the sensor can serve as the illuminance sensor. Moreover, in a case where the sensor needs to serve as a proximity sensor, the spectral characteristic of the first light receiving element section is switched to an infrared spectral characteristic which is suitable for receiving infrared light so as to eliminate influence of visible light, and this makes it possible to cause the sensor to serve as the proximity sensor.

Further, in a case where the sensor serves as the proximity sensor, it is possible, by eliminating influence of visible light as above described, to inhibit malfunction caused by light which is in the visible region and is emitted by a fluorescent lamp or the like.

According to the sensor in accordance with an aspect of the present invention, in the aspect 3, the first switching section can select, as a current signal to be outputted from the first light receiving element section, (i) a combined electric current which is obtained by combining a received light current outputted from the first visible light receiving P-N junction and a received light current outputted from the first infrared light receiving P-N junction or (ii) the received light current outputted from the first infrared light receiving P-N junction.

According to the configuration, the spectral characteristic of the first light receiving element section can be switched to any of an infrared spectral characteristic and a visible-to-infrared spectral characteristic by the switching section.

According to the sensor in accordance with an aspect 5 of the present invention, in the aspect 4, it is possible that an anode of the first infrared light receiving P-N junction is connected with a ground; a cathode of the first visible light receiving P-N junction is connected with a cathode of the first infrared light receiving P-N junction; a connection node between the cathode of the first visible light receiving P-N junction and the cathode of the first infrared light receiving P-N junction serves as an output node of the first light receiving element section; the first switching section includes a first switch and a second switch; one end of the first switch is connected with the output node; another end of the first switch is connected with one end of the second switch; another end of the second switch is connected with a ground; and an anode of the first visible light receiving P-N junction is connected with a connection node between the another end of the first switch and the one end of the second switch.

According to the configuration, the anode of the first infrared light receiving P-N junction is connected with the ground, and the cathode of the first visible light receiving P-N junction is connected with the cathode of the first infrared light receiving P-N junction. From this, an electric current obtained by combining a received light current of the first visible light receiving P-N junction and a received light current of the first infrared light receiving P-N junction is outputted from the output node of the first light receiving element section via the connection node between the cathode of the first visible light receiving P-N junction and the cathode of the first infrared light receiving P-N junction.

Here, when the connection between the cathode and the anode of the first visible light receiving P-N junction is closed by the first switch of the switching section, the received light current of the first visible light receiving P-N junction is not outputted, and only the received light current of the first infrared light receiving P-N junction is to be outputted from the output node of the first light receiving element section. That is, it is possible to switch the spectral characteristic of the first light receiving element section to the infrared spectral characteristic.

Alternatively, when the connection between the anode of the first visible light receiving P-N junction and the ground is closed by the second switch of the switching section, the first visible light receiving P-N junction generates a potential difference by photoelectric conversion in accordance with received visible light, and the first visible light receiving P-N junction can thus output a received light current corresponding to the potential difference. That is, it is possible to switch the spectral characteristic of the first light receiving element section to the visible-to-infrared spectral characteristic.

That is, it is possible to switch the spectral characteristic of the first light receiving element section to the infrared spectral characteristic or the visible-to-infrared spectral characteristic.

According to the sensor in accordance with an aspect 6 of the present invention, in any one of the aspects 1 through 5, the sensor can further include a second light receiving element section which has a second infrared light receiving P-N junction having an infrared light spectral characteristic, the second light receiving element section being provided in a part of the substrate which part corresponds to the opening.

According to the configuration, the second light receiving element section can receive light, which has passed through the opening of the infrared cut-off filter and from which an infrared component has not been removed, before the first light receiving element section receives the light. This allows the second light receiving element section to have high sensitivity with respect to infrared light. That is, it is possible to provide a proximity sensor having high sensitivity.

Moreover, the first light receiving element section can receive light whose infrared component has been absorbed by the second light receiving element section, and therefore the first light receiving element section can further selectively receive visible light. That is, the first light receiving element section can obtain a spectral characteristic nearer to luminous efficacy. From this, it is possible to provide an illuminance sensor having higher sensitivity.

Further, by eliminating influence of visible light as above described, it is possible to inhibit malfunction caused by light which is in the visible region and is emitted by a fluorescent lamp or the like.

According to the sensor in accordance with an aspect 7 of the present invention, in the aspect 6, it is possible that the second light receiving element section further has a second visible light receiving P-N junction having a visible light spectral characteristic; and the sensor further includes a second switching section for switching spectral characteristics of the second light receiving element section.

According to the configuration, the second light receiving element section can have a configuration identical with that of the first light receiving element section. This makes it possible to simplify a process of manufacturing the sensor, and this allows a reduction in cost of the sensor.

According to the sensor in accordance with an aspect 8 of the present invention, in the aspect 7, the second switching section can switch a spectral characteristic of the second light receiving element section to an infrared spectral characteristic or a visible-to-infrared spectral characteristic.

According to the configuration, the spectral characteristic of the second light receiving element section can be switched by operation that is identical with that of the first light receiving element section. Therefore, it is possible to simplify operation of the sensor.

Moreover, in a case where the sensor needs to serve as a proximity sensor, the spectral characteristic of the second light receiving element section is switched to an infrared spectral characteristic which is suitable for receiving infrared light so as to eliminate influence of visible light, and this makes it possible to cause the sensor to serve as the proximity sensor.

Further, in a case where the sensor serves as the proximity sensor, it is possible, by eliminating influence of visible light as above described, to inhibit malfunction caused by light which is in the visible region and is emitted by a fluorescent lamp or the like.

According to the sensor in accordance with an aspect 9 of the present invention, in the aspect 8, the second switching section can select, as an output current from the second light receiving element section, (i) a combined electric current which is obtained by combining a received light current outputted from the second visible light receiving P-N junction and a received light current outputted from the second infrared light receiving P-N junction or (ii) the received light current outputted from the second infrared light receiving P-N junction.

According to the sensor in accordance with an aspect 10 of the present invention, in the aspect 9, it is possible that an anode of the second infrared light receiving P-N junction is connected with a ground; a cathode of the second visible light receiving P-N junction is connected with a cathode of the second infrared light receiving P-N junction; a connection node between the cathode of the second visible light receiving P-N junction and the cathode of the second infrared light receiving P-N junction serves as an output node of the second light receiving element section; the second switching section includes a first switch and a second switch; one end of the first switch is connected with the output node; another end of the first switch is connected with one end of the second switch; another end of the second switch is connected with a ground; and an anode of the second visible light receiving P-N junction is connected with a connection node between (i) the another end of the first switch and (ii) the one end of the second switch.

According to the configuration, the second light receiving element section can have a circuit configuration identical with that of the first light receiving element section. This makes it possible to simplify a circuit configuration of the sensor. It is therefore possible to simplify a process of manufacturing the sensor, and this allows reduction in cost of the sensor.

According to the sensor in accordance with an aspect 11 of the present invention, in any one of the aspects 6 through 10, it is possible that the sensor further includes a first specific color filter which causes light having a first specific color to pass through; and a second specific color filter which causes light having a second specific color to pass through, the first specific color filter being provided so as to cover the first light receiving element section, and the second specific color filter being provided so as to cover the second light receiving element section.

According to the configuration, in a case where the sensor needs to serve as an illuminance sensor, the light receiving element section can obtain a spectral characteristic nearer to luminous efficacy by receiving light from which (i) an infrared component has been removed by the infrared cut-off filter and (ii) a visible light component has been selectively extracted by the first specific color filter.

In a case where the sensor needs to serve as a proximity sensor, the other light receiving element section can obtain high sensitivity with respect to infrared light by receiving light from which a visible light component has been selectively removed by the second specific color filter.

According to the sensor in accordance with an aspect 12 of the present invention, in the aspect 11, the second specific color can be blue.

According to the configuration, it is possible to cause the infrared light receiving P-N junction to receive light which has passed through a blue filter that blocks light having a wavelength of, for example, 600 nm to 800 nm. This makes it possible to obtain a spectral characteristic that has higher sensitivity with respect to infrared light having a wavelength of, for example, 900 nm to 950 nm.

According to the sensor in accordance with an aspect 13 of the present invention, in the aspect 11 or 12, the first specific color can be red, green, or blue.

According to the configuration, it is possible to provide an RGB color sensor that includes visible light receiving P-N junctions corresponding to three primary colors.

According to the sensor in accordance with an aspect 14 of the present invention, in the aspect 13, the first specific color can be green.

Here, the green filter is known to have a spectral characteristic near to luminous efficacy.

According to the configuration, it is possible to cause the visible light receiving P-N junction to receive light which has passed through the green filter. This makes it possible to obtain a spectral characteristic nearer to luminous efficacy.

According to the sensor in accordance with an aspect 15 of the present invention, in any one of the aspects 1 through 14, a width of the opening can be 5 um or greater.

Here, the opening can be provided in the infrared cut-off filter by a lift-off method. In the lift-off method, (i) a resist is provided in an area in which an opening is to be provided, (ii) an infrared cut-off filter, which is made of a material such as niobium pentoxide ($Nb_2O_5$) is formed over the resist, and then (iii) the resist and a part of the infrared cut-off filter, which part is above the resist, are removed. In a case where the lift-off method is used, an infrared cut-off filter having an intended shape can be obtained, provided that a width of the resist is 5 um or greater.

According to the configuration, the width of the opening is 5 um or greater. From this, by providing the opening in the infrared cut-off filter with, for example, the lift-off method, it is possible to cause the resist, which corresponds to a shape of the opening, to have a width of 5 um or greater, and this makes it possible to obtain the opening having an intended shape.

According to the sensor in accordance with an aspect 16 of the present invention, in any one of the aspects 1 through 15, the infrared cut-off filter can be a metal multilayer film.

According to the configuration, it is possible to easily and accurately form the infrared cut-off filter in a specific area of the light receiving element by a semiconductor manufacturing process.

According to the sensor in accordance with an aspect 17 of the present invention, in the aspect 16, the metal multilayer film can include a layer of $SiO_2$ and a layer of $Nb_2O_5$.

According to the configuration, the infrared cut-off filter can remove more infrared components from light that passes through the infrared cut-off filter. Moreover, by utilizing interference of light, the infrared cut-off filter can select a wavelength of light which passes through the infrared cut-off filter.

According to the sensor in accordance with an aspect 18 of the present invention, in any one of the aspects 1 through 17, it is possible that the sensor further includes a resin sealing part for sealing the light receiving element section, the resin sealing part having a lens part (lens 42) whose shape is a lens shape, and the substrate facing the lens part.

Here, in a case where a size of the light receiving element section is reduced, light to be received is converged onto a smaller area by, for example, a lens or the like. Moreover, in a case where light to be received is converged onto a smaller area by a lens or the like, a focal point of the lens is conformed to the smaller area. In such a case, it is preferable to fix relative locations of the lens and the area onto which light is to be converged.

According to the configuration, the light receiving element section having a function as an illuminance sensor and a function as a proximity sensor is sealed by the resin sealing part, and light is converged by the lens part which is provided on part of a surface of the resin sealing part and has a lens shape. This makes it possible to fix relative locations such that the light receiving element section faces the lens part, and the light receiving element section can therefore accurately receive light even in a case where a size of the light receiving element section is reduced. That is, by reducing the size of the light receiving element section and integrating the light receiving element section with the resin sealing part having the surface which partially has the lens shape, it is possible to reduce a size of the entire sensor, and this makes it possible to provide a small single-unit illuminance/proximity sensor.

Note that, not only the light receiving element section but also the infrared cut-off filter can be sealed by the resin sealing part. According to the arrangement, for example, the infrared cut-off filter does not need to be provided on a surface of the resin sealing part, and an arbitrary lens shape can be provided on a surface of the light receiving element section so that light is converged onto the light receiving element section.

Moreover, by thus converging light onto the light receiving element section by the lens shape, it is possible to improve sensitivity of the light receiving element section with respect to visible light and infrared light.

According to the sensor in accordance with an aspect 19 of the present invention, in any one of the aspects 1 through 18, it is possible that the sensor further includes a light emitting diode; and a light emitting diode driving circuit for driving the light emitting diode, and the light receiving element section receives light emitted by the light emitting diode.

According to the configuration, while the light emitting diode is not driven, the sensor can serve as an illuminance sensor. Alternatively, while the light emitting diode is driven, light is detected which has been emitted by the light emitting diode and then reflected by an object proximate to the sensor, and thus the sensor serves as a proximity sensor. As such, it is possible to provide the single-unit illuminance/proximity sensor.

According to the sensor in accordance with an aspect 20 of the present invention, in any one of the aspects 1 through 19, it is possible that the sensor further includes an analog-digital converting circuit for converting a current signal (input signal), which has been outputted from the light receiving element section, into a digital signal.

According to the configuration, it is possible to convert an amount of visible light and an amount of infrared light, which have been received by the light receiving element section, into respective digital values. From this, it is possible to apply an intended digital process to each of the digital values.

According to the sensor in accordance with an aspect 21 of the present invention, in the aspect 20, it is possible that the analog-digital converting circuit is an integral analog-digital converting circuit which includes: an integrating circuit which (i) has an integrating capacitor for storing an electric charge corresponding to the current signal and (ii) outputs a voltage corresponding to an amount of electric charge stored in the integrating capacitor, a comparison circuit which (i) compares a magnitude of the output voltage of the integrating circuit with a magnitude of a reference voltage and (ii) outputs a comparison result as a pulse signal which is a binary signal, an output circuit which has (i) a flip-flop that takes in the pulse signal in sync with a clock signal and outputs a bit stream signal and (ii) a counter for counting active pulses of the bit stream signal, the output circuit outputting a counted result by the counter as an output value of the analog-digital converting circuit, and a discharge circuit for outputting an electric current in an active pulse period of the bit stream signal so as to cause the integrating capacitor to discharge.

According to the configuration, a total of active pulse periods is to be reflected as a magnitude of a current signal to be outputted by the light receiving element section. Then, the pulsed current outputted by the output circuit is integrated (i.e., averaged) by the integrating circuit, and thus a signal can be obtained by accurate analog-digital conversion carried out with the simple configuration.

That is, it is possible to provide the sensor which (i) has a wide dynamic range, (ii) can carry out high resolution analog-digital conversion, and (iii) is suitable for an illuminance sensor and a proximity sensor.

According to the display device in accordance with an aspect 22 of the present invention, it is possible that the display device includes a liquid crystal panel for displaying a screen; a backlight for emitting light toward the liquid crystal panel; a backlight control section for controlling a luminance of the backlight; and the sensor described in any one of the aspects 1 through 21, the backlight control section controlling the luminance of the backlight based on a signal outputted from the sensor.

According to the configuration, the display device includes the sensor that can accurately detect color components (illuminance information) in ambient light, and the display device can therefore accurately control a brightness of a screen in accordance with an illuminance of ambient light. Moreover, the display device includes the sensor that can accurately detect proximity of a nearby object, and the display device can therefore control a luminance of the backlight in accordance with proximity of such a nearby object.

Note that the signal outputted from the sensor can be converted by the above described analog-digital converting circuit. In such a case, the backlight control section can control a luminance of the backlight based on the output signal thus converted.

Each of the mobile telephone in accordance with an aspect 23 of the present invention and the digital camera in accordance with an aspect 24 of the present invention can includes the display device of the aspect 22.

According to the configuration, it is possible to provide an applied product such as a mobile telephone or a digital camera which has (i) a display function for accurately controlling a brightness of a screen in accordance with an illuminance of ambient light and (ii) a display function for controlling a luminance of the backlight in accordance with proximity of a nearby object.

Note that the applied product is not limited to this configuration, and it is possible to provide a smart phone and that like each of which has the display functions above described.

ADDITIONAL REMARKS

The present invention is not limited to the embodiments, but can be altered by a skilled person in the art within the scope of the claims. An embodiment derived from a proper combination of technical means disclosed in respective different embodiments is also encompassed in the technical scope of the present invention.

INDUSTRIAL APPLICABILITY

The present invention is applicable to devices such as (i) a liquid crystal panel which can control a luminance of a backlight and (ii) a mobile telephone, a digital camera, and a smart phone each of which includes the liquid crystal panel.

REFERENCE SIGNS LIST

1: Sensor
2: Sensor

3: Sensor
4: Sensor
5: Display device
6: Applied product (mobile telephone, digital camera)
15: Charging circuit
16: Discharge circuit
17: Comparison circuit
18: Control circuit
41: Resin sealing part
42: Lens (lens part)
45: LED
51: Backlight control section
52: Backlight
55: Liquid crystal panel
ADC: Digital conversion circuit
C1: Capacitor
CF: Color filter (specific color filter)
CF(R): Red filter (specific color filter)
CF(G): Green filter (specific color filter)
CF(B): Blue filter (specific color filter)
COUNT: Counter
DC: Light emitting diode driving circuit
E1: Light receiving element section (first light receiving element section)
E2: Light receiving element section (second light receiving element section)
FF: Flip-flop
IRcutF: Infrared cut-off filter
Iin: Input current (current signal)
LED: Light emitting diode
N1: Connection node (output node)
N2: Connection node
PDir: Photodiode (infrared light receiving P-N junction)
PDvis: Photodiode (visible light receiving P-N junction)
S1: Visible light detecting section
S2: Infrared light detecting section
SW11: Switch (first switch)
SW12: Switch (second switch)
SW21: Switch (first switch)
SW22: Switch (second switch)
SWS: Switching section
Vref: Reference voltage
Vsig: Output voltage
charge: Bit stream signal
clk: Clock signal

The invention claimed is:

1. A sensor comprising:
a first light receiving element section which is provided in a substrate, the first light receiving element section having (i) a first visible light receiving P-N junction that has a visible spectral characteristic and (ii) a first infrared light receiving P-N junction that has an infrared spectral characteristic;
an infrared cut-off filter which is provided so as to cover the first light receiving element section, the infrared cut-off filter removing an infrared component from light; and
a first switching section for switching spectral characteristics of the first light receiving element section,
the infrared cut-off filter having an opening, and
the first infrared light receiving P-N junction being provided at a location deeper in the substrate than the visible light receiving P-N junction.

2. The sensor as set forth in claim 1, wherein:
the opening is provided in the infrared cut-off filter so as to surround the first light receiving element section.

3. The sensor as set forth in claim 1, wherein:
the first switching section switches a spectral characteristic of the first light receiving element section to the infrared spectral characteristic or a visible-to-infrared spectral characteristic.

4. The sensor as set forth in claim 3, wherein:
the first switching section selects, as a current signal to be outputted from the first light receiving element section, (i) a combined electric current which is obtained by combining a received light current outputted from the first visible light receiving P-N junction and a received light current outputted from the first infrared light receiving P-N junction or (ii) the received light current outputted from the first infrared light receiving P-N junction.

5. The sensor as set forth in claim 4, wherein:
an anode of the first infrared light receiving P-N junction is connected with a ground;
a cathode of the first visible light receiving P-N junction is connected with a cathode of the first infrared light receiving P-N junction;
a connection node between the cathode of the first visible light receiving P-N junction and the cathode of the first infrared light receiving P-N junction serves as an output node of the first light receiving element section;
the first switching section includes a first switch and a second switch;
one end of the first switch is connected with the output node;
another end of the first switch is connected with one end of the second switch;
another end of the second switch is connected with a ground; and
an anode of the first visible light receiving P-N junction is connected with a connection node between the another end of the first switch and the one end of the second switch.

6. The sensor as set forth in claim 1, further comprising:
a second light receiving element section which has a second infrared light receiving P-N junction having an infrared spectral characteristic,
the second light receiving element section being provided in a part of the substrate which part corresponds to the opening.

7. The sensor as set forth in claim 6, wherein:
the second light receiving element section further has a second visible light receiving P-N junction having a visible spectral characteristic; and
said sensor further comprises a second switching section for switching spectral characteristics of the second light receiving element section.

8. The sensor as set forth in claim 7, wherein:
the second switching section switches a spectral characteristic of the second light receiving element section to the infrared spectral characteristic or a visible-to-infrared spectral characteristic.

9. The sensor as set forth in claim 8, wherein:
the second switching section selects, as an output current from the second light receiving element section, (i) a combined electric current which is obtained by combining a received light current outputted from the second visible light receiving P-N junction and a received light current outputted from the second infrared light receiving P-N junction or (ii) the received light current outputted from the second infrared light receiving P-N junction.

10. The sensor as set forth in claim 9, wherein:

an anode of the second infrared light receiving P-N junction is connected with a ground;

a cathode of the second visible light receiving P-N junction is connected with a cathode of the second infrared light receiving P-N junction;

a connection node between the cathode of the second visible light receiving P-N junction and the cathode of the second infrared light receiving P-N junction serves as an output node of the second light receiving element section;

the second switching section includes a first switch and a second switch;

one end of the first switch is connected with the output node;

another end of the first switch is connected with one end of the second switch;

another end of the second switch is connected with a ground; and an anode of the second visible light receiving P-N junction is connected with a connection node between (i) the another end of the first switch and (ii) the one end of the second switch.

11. The sensor as set forth in claim 6, further comprising:

a first specific color filter which causes light having a first specific color to pass through; and a second specific color filter which causes light having a second specific color to pass through, the first specific color filter being provided so as to cover the first light receiving element section, and the second specific color filter being provided so as to cover the second light receiving element section.

12. The sensor as set forth in claim 11, wherein the second specific color is blue.

13. The sensor as set forth in claim 11, wherein the first specific color is red, green, or blue.

14. The sensor as set forth in claim 13, wherein the first specific color is green.

15. The sensor as set forth in claim 1, wherein a width of the opening is 5 um or greater.

16. The sensor as set forth in claim 1, wherein the infrared cut-off filter is a metal multilayer film.

17. The sensor as set forth in claim 16, wherein the metal multilayer film includes a layer of $SiO_2$ and a layer of $Nb_2O_5$.

18. A display device comprising:

a liquid crystal panel for displaying a screen;

a backlight for emitting light toward the liquid crystal panel;

a backlight control section for controlling a luminance of the backlight; and a sensor recited in claim 1, the backlight control section controlling the luminance of the backlight based on a signal outputted from the sensor.

19. A mobile telephone comprising a display device recited in claim 18.

20. A digital camera comprising a display device recited in claim 18.

* * * * *